US012719237B2

(12) United States Patent
Higuchi

(10) Patent No.: US 12,719,237 B2
(45) Date of Patent: Aug. 25, 2026

(54) OPTICAL SEMICONDUCTOR DEVICE, OPTICAL UNIT, AND METHOD FOR MANUFACTURING OPTICAL UNIT

(71) Applicant: HAMAMATSU PHOTONICS K.K., Hamamatsu (JP)

(72) Inventor: Akira Higuchi, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 960 days.

(21) Appl. No.: 17/944,404

(22) Filed: Sep. 14, 2022

(65) Prior Publication Data

US 2023/0079029 A1 Mar. 16, 2023

(30) Foreign Application Priority Data

Sep. 16, 2021 (JP) ................................ 2021-151240

(51) Int. Cl.
*H01S 5/026* (2006.01)
*H01S 5/028* (2006.01)
(Continued)

(52) U.S. Cl.
CPC ............ *H01S 5/2027* (2013.01); *H01S 5/026* (2013.01); *H01S 5/0234* (2021.01); *H01S 5/0235* (2021.01); *H01S 5/0237* (2021.01); *H01S 5/0287* (2013.01)

(58) Field of Classification Search
CPC ......... H01S 5/021; H01S 5/026; H01S 5/0287
See application file for complete search history.

(56) References Cited

U.S. PATENT DOCUMENTS

2008/0198888 A1* 8/2008 Arimoto ............... H01S 5/0424 359/344
2017/0207600 A1* 7/2017 Klamkin ................. H01S 5/142
(Continued)

FOREIGN PATENT DOCUMENTS

JP S61-280687 A 12/1986
JP H07312460 A 11/1995
(Continued)

OTHER PUBLICATIONS

Fang, Alexander W. et al., "Hybrid silicon evanescent devices," Materialstoday, vol. 10, No. 7-8, Jul.-Aug. 2007, pp. 28-35.
(Continued)

*Primary Examiner* — Michael Carter
(74) *Attorney, Agent, or Firm* — FAEGRE DRINKER BIDDLE & REATH LLP

(57) ABSTRACT

An optical semiconductor device includes: a semiconductor substrate including a first main surface and a second main surface; a stacked body that is formed on the first main surface and includes an active layer and a contact layer arranged on a side opposite to the semiconductor substrate with respect to the active layer; a first electrode in contact with the contact layer; and a second electrode formed on the second main surface. The stacked body includes a light transmitting portion formed by not covering at least part of a surface of the contact layer on a side opposite to the semiconductor substrate with the first electrode. The optical semiconductor device is configured such that a waveguide mode is not formed by current application through the first electrode and the second electrode in a state in which the light transmitting portion is not in optical contact with an external member.

16 Claims, 23 Drawing Sheets

(51) Int. Cl.

| | |
|---|---|
| ***H01S 5/20*** | (2006.01) |
| *H01S 5/0234* | (2021.01) |
| *H01S 5/0235* | (2021.01) |
| *H01S 5/0237* | (2021.01) |

(56) References Cited

U.S. PATENT DOCUMENTS

| | | | | |
|---|---|---|---|---|
| 2018/0183211 | A1 | 6/2018 | Doussiere et al. | |
| 2020/0313397 | A1* | 10/2020 | Jung | H01S 5/3406 |
| 2021/0151953 | A1* | 5/2021 | Osinski | H01S 5/4006 |

FOREIGN PATENT DOCUMENTS

| | | | |
|---|---|---|---|
| JP | 2000040858 | A | 2/2000 |
| JP | 2001185805 | A | 7/2001 |
| JP | 2008-198957 | A | 8/2008 |
| JP | 2009542033 | A | 11/2009 |
| JP | 2012151327 | A | 8/2012 |
| JP | 2013534059 | A | 8/2013 |
| WO | 2018212195 | A1 | 11/2018 |

OTHER PUBLICATIONS

Menezo, S. et al., Advances on III-V on Silicon DBR and DFB Lasers for WDM Optical Interconnects andAssociated Heterogeneous Integration 20 0mm-Wafer-Scale Technology, 2014 IEEE Compound Semiconductor Integrated Circuit Symposium (CSICS), IEEE, Oct. 19, 2014, https://ieeexplore.ieee.org/document/6978538,DOI:10.1109/CSICS.2014.6978538IEL.

* cited by examiner

*Fig.4*

| REGION | LAYER | MATERIAL, FILM THICKNESS, REFRACTIVE INDEX, CARRIER CONCENTRATION |
|---|---|---|
| FIRST REGION | SEMI-CONDUCTOR SUBSTRATE | Si-InP<br>THICKNESS:200μm、REFRACTIVE INDEX:3.17<br>CARRIER CONCENTRATION:[n]=1.0E+18(cm-3) |
| SECOND REGION | BUFFER LAYER | Si-InP<br>THICKNESS:500nm、REFRACTIVE INDEX3.17<br>CARRIER CONCENTRATION:[n]=1.0E+18(cm-3) |
| | FIRST OPTICAL GUIDE LAYER | Si-$(Al_{0.48}In_{0.52}As)_{0.55}/(Ga_{0.47}In_{0.53}As)_{0.45}$<br>THICKNESS:50nm、REFRACTIVE INDEX:3.30<br>CARRIER CONCENTRATION:[n]=2.0E+17(cm-3) |
| | ACTIVE LAYER | FIRST QUANTUM WELL LAYER<br>Si-$(Ga_{0.47}In_{0.53}As)$<br>THICKNESS:10nm、REFRACTIVE INDEX:3.54<br>CARRIER CONCENTRATION:[n]=1.0E+17(cm-3) |
| | | FIRST BARRIER LAYER<br>Si-$(Al_{0.48}In_{0.52}As)_{0.55}/(Ga_{0.47}In_{0.53}As)_{0.45}$<br>THICKNESS:10nm、REFRACTIVE INDEX:3.30<br>CARRIER CONCENTRATION:[n]=1.0E+17(cm-3) |
| | | SECOND QUANTUM WELL LAYER (SAME AS FIRST QUANTUM WELL LAYER DESCRIBED ABOVE) |
| | | SECOND BARRIER LAYER (SAME AS FIRST BARRIER LAYER DESCRIBED ABOVE) |
| | | THIRD QUANTUM WELL LAYER (SAME AS FIRST AND SECOND QUANTUM WELL LAYERS DESCRIBED ABOVE) |
| | SECOND OPTICAL GUIDE LAYER | Zn-$(Al_{0.48}In_{0.52}As)_{0.55}/(Ga_{0.47}In_{0.53}As)_{0.45}$<br>THICKNESS:10nm、REFRACTIVE INDEX:3.30<br>CARRIER CONCENTRATION:[p]=2.0E+17(cm-3) |
| | CONTACT LAYER | Zn-$(Ga_{0.50\sim0.48}In_{0.50\sim0.52}As)$<br>THICKNESS:100nm、REFRACTIVE INDEX:3.56<br>CARRIER CONCENTRATION:[p]=(5.0~20.0)E+18(cm-3) |
| THIRD REGION | | AIR |

CARRIER INJECTION
(CURRENT APPLICATION)
5
10
33
4
C
50
36
WAVEGUIDE MODE
IS FORMED
8
5
8
10
50
36
C
33

CARRIER INJECTION
INCREASE
5
10
33
4
C
36
50
8
5
8
10
36
C
33
50

EQUIVALENT REFRACTIVE INDEX Neff CALCULATED BY ITERATIVE METHOD 3.176
3.175
3.174
3.173
3.172
3.171
3.170
3.169

40 45 50 55 60 65 70 75 80 85 90 95 100 105 110 115 120 125 130

THICKNESS OF FIRST OPTICAL GUIDE LAYER (nm)

OPTICAL SEMICONDUCTOR DEVICE, OPTICAL UNIT, AND METHOD FOR MANUFACTURING OPTICAL UNIT

TECHNICAL FIELD

The present disclosure relates to an optical semiconductor device, an optical unit, and a method for manufacturing an optical unit.

BACKGROUND

Silicon photonics for integrated optical components, such as a waveguide, a diffraction grating, and a photoreceiver, on a silicon substrate by using microfabrication technology and creating a new function by using the high speed of light has been drawing attention. As a related technique, Non-Patent Literature "Hybrid silicon evanescent devices", Materials today JULY-AUGUST Vol. 10, Number 7-8, p 28-35. describes a technique for bonding a semiconductor laser to a silicon waveguide and introducing light from the semiconductor laser into the silicon waveguide.

SUMMARY

In the technique described in the Non-Patent Literature, in order to introduce the light from the semiconductor laser into the silicon waveguide with high efficiency, extremely high accuracy is required for the bonding between the semiconductor laser and the silicon waveguide. For this reason, the productivity may be reduced. It is an object of the present disclosure to provide an optical semiconductor device, an optical unit, and a method for manufacturing an optical unit capable of introducing light into a waveguide member easily and efficiently.

An optical semiconductor device according to an aspect of the present disclosure includes: a semiconductor substrate including a first main surface and a second main surface on a side opposite to the first main surface; a stacked body that is formed on the first main surface and includes an active layer and a contact layer arranged on a side opposite to the semiconductor substrate with respect to the active layer; a first electrode in contact with the contact layer; and a second electrode formed on the second main surface. The stacked body includes a light transmitting portion formed by not covering at least part of a surface of the contact layer on a side opposite to the semiconductor substrate with the first electrode. The optical semiconductor device is configured such that a waveguide mode is not formed by current application through the first electrode and the second electrode in a state in which the light transmitting portion is not in optical contact with an external member.

In the optical semiconductor device, the stacked body includes the light transmitting portion formed by not covering at least part of the surface of the contact layer on a side opposite to the semiconductor substrate with the first electrode. Therefore, for example, by bringing the waveguide member into optical contact with the light transmitting portion, the optical semiconductor device and the waveguide member can be brought into optical contact with each other. In addition, the optical semiconductor device is configured such that a waveguide mode is not formed by current application through the first electrode and the second electrode in a state in which the light transmitting portion is not in optical contact with an external member (for example, a waveguide member). On the other hand, in a state in which the light transmitting portion is in optical contact with an external member, a waveguide mode can be formed by current application through the first electrode and the second electrode. In this case, for example, when the waveguide member is in optical contact with the light transmitting portion in a state in which a current is applied through the first electrode and the second electrode, a large amount of carriers are consumed to reduce the differential resistance in a contact portion between the light transmitting portion and the waveguide member, so that the current concentrates in the contact portion. As a result, a current path is formed in a portion of the stacked body directly above the contact portion, and light from the optical semiconductor device is introduced into the waveguide member in the contact portion. Thus, when the optical semiconductor device and the waveguide member are assembled, a light introduction region is formed in the contact portion by bringing the waveguide member into contact with the light transmitting portion of the optical semiconductor device. Therefore, for example, as compared with a case where a semiconductor laser having a predetermined light emitting region is bonded to the waveguide member so that light is introduced with high efficiency, it is possible to reduce the accuracy required for assembly between the optical semiconductor device and the waveguide member. As a result, it is possible to introduce the light into the waveguide member easily and efficiently.

The stacked body may be configured as a ridge structure on the semiconductor substrate, or the stacked body may include a current confinement structure formed by partially increasing the electrical resistance of the stacked body. In this case, since the current density in the stacked body can be increased, it is possible to increase the optical gain.

In a direction perpendicular to the first main surface, a distance from the active layer to the first main surface may be longer than a distance from the active layer to the contact layer. In this case, the optical semiconductor device can be configured such that a waveguide mode is not formed by current application through the first electrode and the second electrode in a state in which the light transmitting portion is not in optical contact with an external member.

The stacked body may include a pair of end surfaces perpendicular to an extending direction of the active layer, and a high reflection film may be formed on each of the pair of end surfaces. In this case, since the light leaking from the end surfaces can be reduced, it is possible to further improve the efficiency.

The optical semiconductor device may be configured as a semiconductor laser device. In this case, the light generated in the optical semiconductor device can be introduced into the waveguide member.

The stacked body may include a pair of end surfaces perpendicular to an extending direction of the active layer, and a low reflection film may be formed on each of the pair of end surfaces. In this case, since the oscillation of light in the stacked body can be suppressed, the optical semiconductor device can function as a semiconductor optical amplifier.

The stacked body may include a pair of end surfaces inclined with respect to an extending direction of the active layer, and a high reflection film may be formed on each of the pair of end surfaces. In this case, it is possible to make the optical semiconductor device function as a semiconductor optical amplifier while reducing the light leaking from the end surfaces.

The optical semiconductor device may be configured as a semiconductor optical amplifier. In this case, the light amplified in the optical semiconductor device can be introduced into the waveguide member.

In the light transmitting portion, the at least part of the surface of the contact layer may be exposed to an outside. In this case, it is possible to suppress the degradation of the polarization characteristics due to the excessive stress applied to the optical semiconductor device. Alternatively, the light transmitting portion may include a semiconductor thin film formed on the at least part of the surface of the contact layer. In this case, since the refractive index can be adjusted by selecting the material composition of the semiconductor thin film, it is possible to form a desired waveguide mode.

The entire light transmitting portion may overlap the active layer when viewed from a direction perpendicular to the first main surface. In this case, since it is possible to secure a wide range of contact with the waveguide member in the light transmitting portion, it is possible to further simplify the introduction of light into the waveguide member.

The light transmitting portion may be formed by not covering the entire surface of the contact layer with the first electrode. In this case, since it is possible to secure a wide range of contact with the waveguide member in the light transmitting portion, it is possible to further simplify the introduction of light into the waveguide member. In addition, it is possible to suppress the occurrence of a situation in which the waveguide member comes into contact with and interferes with the first electrode when the waveguide member is brought into contact with the light transmitting portion.

An optical unit according to another aspect of the present disclosure includes: the optical semiconductor device described above; and a waveguide member formed of one or more semiconductor materials and in optical contact with the light transmitting portion, and is configured such that a waveguide mode is formed within the optical semiconductor device by current application through the first electrode and the second electrode. According to the optical unit, it is possible to introduce light into the waveguide member easily and efficiently for the reasons described above.

A width of the waveguide member may be narrower than a width of the contact layer of the optical semiconductor device. When the width of the waveguide member is narrow as described above, assembly between the optical semiconductor device and the waveguide member is difficult. However, according to the optical unit, even in such a case, light can be easily introduced into the waveguide member.

Assuming that a cross section that passes through a contact portion between the light transmitting portion and the waveguide member and is perpendicular to the first main surface is a first cross section and a cross section that passes through the light transmitting portion but does not pass through the contact portion and is perpendicular to the first main surface is a second cross section, the optical unit may be configured such that a waveguide mode is formed within the optical semiconductor device by the current application in the first cross section and no waveguide mode is formed within the optical semiconductor device by the current application in the second cross section. In this case, the current can be concentrated on the first cross section.

A method for manufacturing an optical unit according to still another aspect of the present disclosure includes: a first step of preparing the optical semiconductor device described above and a waveguide member formed of one or more semiconductor materials; and a second step of fixing the optical semiconductor device and the waveguide member to each other in a state in which the light transmitting portion of the optical semiconductor device and the waveguide member are in optical contact with each other. According to the method for the optical unit, it is possible to introduce light into the waveguide member easily and efficiently for the reasons described above.

In the first step, the waveguide member fixed on a substrate may be prepared, and in the second step, the optical semiconductor device and the waveguide member may be fixed to each other by fixing the optical semiconductor device and the substrate to each other. In this case, since the optical semiconductor device and the substrate are fixed to each other, it is possible to secure the fixing strength between the semiconductor device and the waveguide member regardless of the bonding strength between the light transmitting portion of the optical semiconductor device and the waveguide member.

According to the present disclosure, it is possible to provide the optical semiconductor device, the optical unit, and the method for manufacturing the optical unit capable of introducing light into the waveguide member easily and efficiently.

BRIEF DESCRIPTION OF THE DRAWINGS

FIG. 4 is a diagram showing a configuration example of the optical semiconductor device.

FIG. 15A is a plan view and FIG. 15B is a cross-sectional view.

FIG. 16A is a plan view and FIG. 16B is a cross-sectional view.

FIG. 17A is a plan view and FIG. 17B is a cross-sectional view.

DETAILED DESCRIPTION

Figure 1:
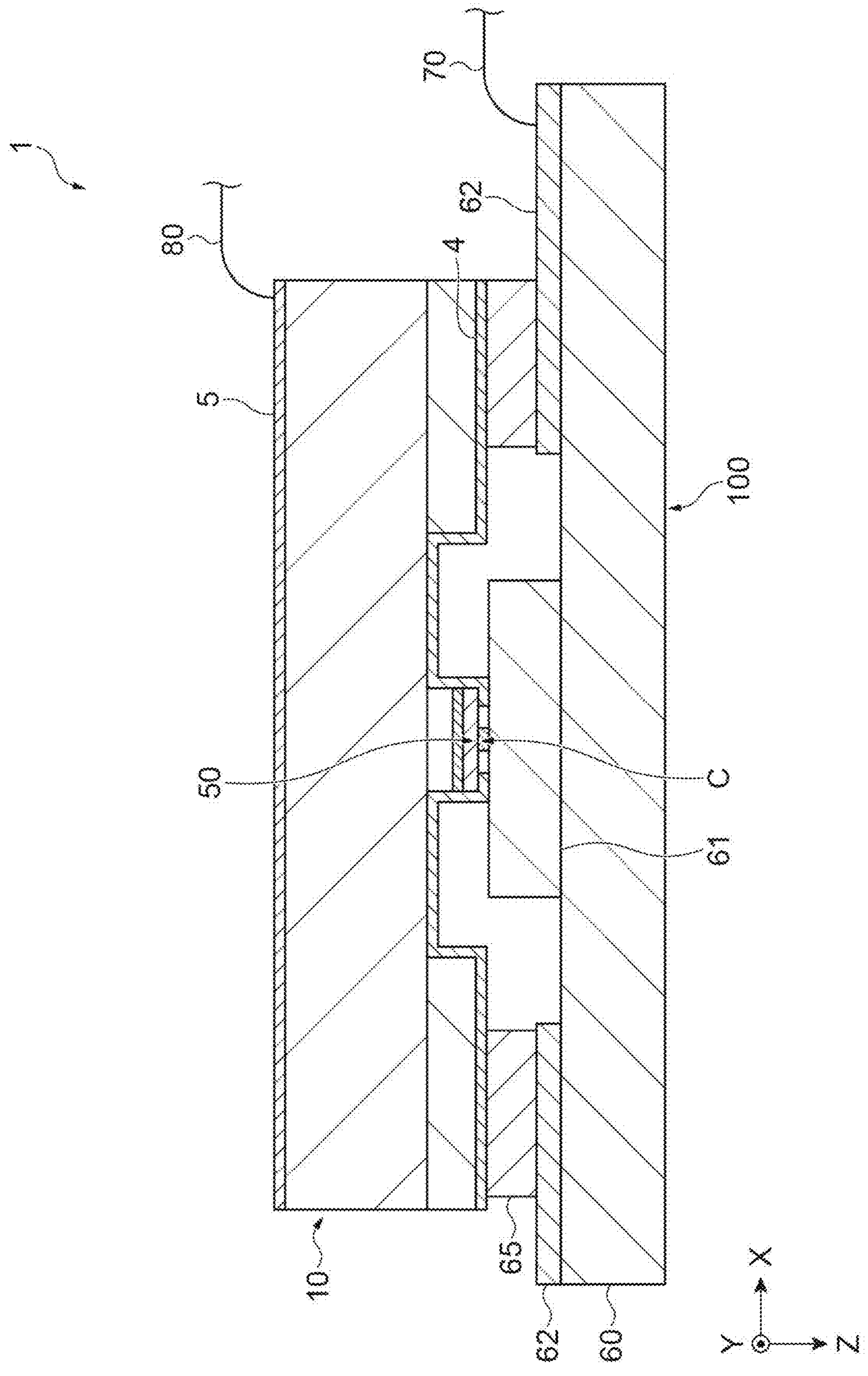
FIG. 1 is a cross-sectional view of an optical unit according to an embodiment.

Hereinafter, an embodiment of the present disclosure will be described in detail with reference to the diagrams In addition, in the following description, the same or equivalent elements are denoted by the same reference numerals, and repeated description thereof will be omitted.

[Optical Unit]

Figure 2:
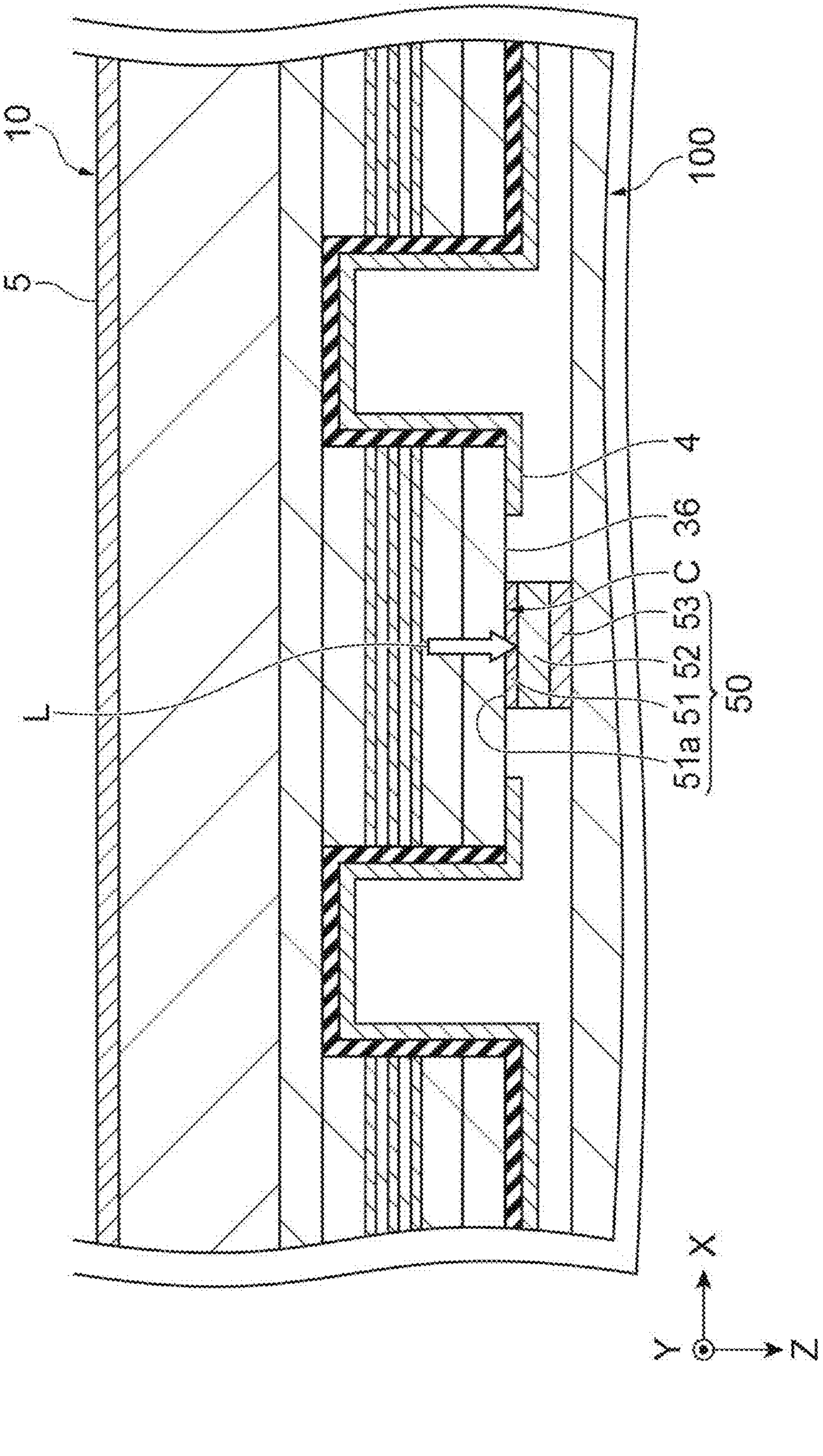
FIG. 2 is a partially enlarged view of FIG. 1.

As shown in FIGS. 1 and 2, an optical unit 1 includes an optical semiconductor device 10 and a waveguide unit 100. The optical semiconductor device 10 is, for example, a semiconductor laser device (laser diode) that generates light L, which is laser light. The waveguide unit 100 has a waveguide member 50. In the optical unit 1, the optical semiconductor device 10 and the waveguide member 50 are in optical contact with each other at a contact portion C, and the light L generated in the optical semiconductor device 10 is introduced into the waveguide member 50 through the contact portion C. The optical semiconductor device 10 is formed in an approximately rectangular parallelepiped shape. The following explanation will be given on the assumption that the width direction, the depth direction, and the height direction of the optical semiconductor device 10 are an X direction, a Y direction, and a Z direction, respectively. The X, Y, and Z directions are perpendicular to each other. FIGS. 1 to 3 and 6 show cross sections perpendicular to the Y direction.

The waveguide unit 100 includes the waveguide member 50, a substrate 60, a plate-shaped member 61, and a pair of electrodes 62. The waveguide member 50 is a silicon waveguide formed of, for example, silicon (Si) or silicon nitride (SiN). The waveguide member 50 extends along the Y direction, and has a uniform rectangular cross section in the Y direction. Details of the waveguide member 50 will be described later.

The substrate 60 is, for example, a rectangular plate-shaped silicon substrate formed of silicon. The waveguide member 50 is fixed on the substrate 60 via the plate-shaped member 61. That is, the plate-shaped member 61 is fixed on the substrate 60, and the waveguide member 50 is fixed on the plate-shaped member 61. The plate-shaped member 61 is formed in a rectangular plate shape by using, for example, silicon oxide ($SiO_2$). The pair of electrodes 62 are formed on the substrate 60 so as to interpose the plate-shaped member 61 therebetween in the X direction (so as to be located on both sides of the waveguide member 50 in the X direction when viewed from the Z direction).

The optical semiconductor device 10 is fixed on each electrode 62 by a fixing material 65. More specifically, the optical semiconductor device 10 is fixed to the waveguide unit 100 by fixing a first electrode 4 of the optical semiconductor device 10, which will be described later, to each electrode 62 via the fixing material 65. The fixing material 65 is, for example, solder, and the first electrode 4 is electrically connected to each electrode 62 via the fixing material 65. A wire 70 on the anode side is electrically connected to one of the electrodes 62, and a wire 80 on the cathode side is electrically connected to a second electrode 5 of the optical semiconductor device 10, which will be described later. A current is applied to the first electrode 4 and the second electrode 5 through the wires 70 and 80.

As shown in FIG. 2, in the optical unit 1, the optical semiconductor device 10 and the waveguide member 50 are in optical contact (optically coupled) with each other at the contact portion C. "Optical contact" includes not only a state in which both members are in direct contact with each other as in the present embodiment but also a state in which a minute gap (for example, an air gap of about 50 nm) is present between the two members. When there is air in the gap, the refractive index of the gap is 1. In the optical unit 1, the light L generated in the optical semiconductor device 10 is introduced into the waveguide member 50 through the contact portion C. In this example, the optical semiconductor device 10 and the waveguide member 50 are bonded (fixed) to each other at the contact portion C. Details of this bonding will be described later.

[Optical Semiconductor Device]

Figure 3:
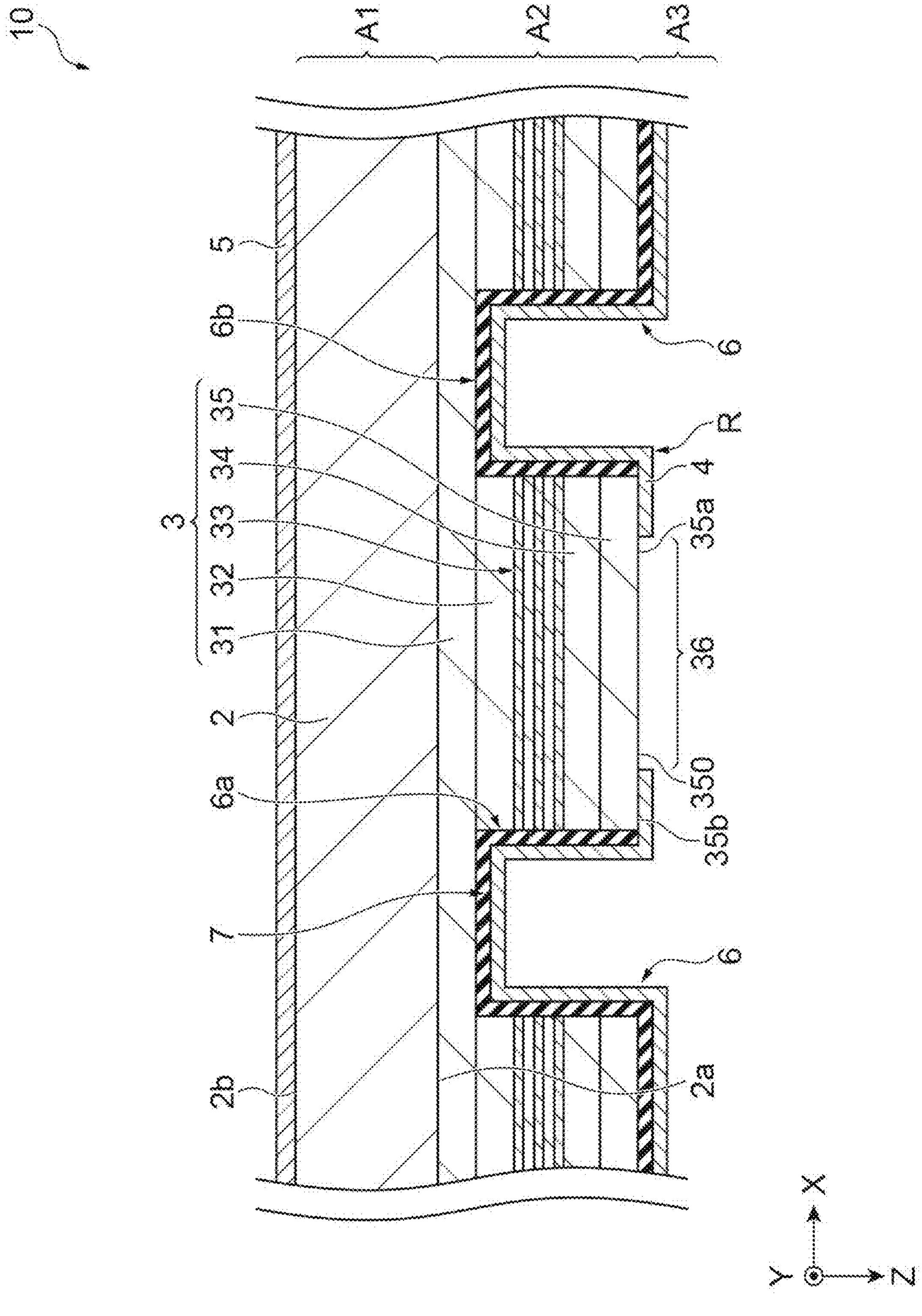
FIG. 3 is a cross-sectional view of an optical semiconductor device.

As shown in FIG. 3, the optical semiconductor device 10 includes a semiconductor substrate 2, a stacked body 3, the first electrode 4, and the second electrode 5. The optical semiconductor device 10 is, for example, a multilayer structure formed of an InP-based, GaAs-based, InGaP-based, or GaN-based Group III-V compound semiconductor material.

The semiconductor substrate 2 is, for example, a semi-insulating InP substrate, and is formed in a rectangular flat plate shape. The semiconductor substrate 2 has a first main surface 2*a* and a second main surface 2*b* on a side opposite to the first main surface 2*a*. The first main surface 2*a* and the second main surface 2*b* are, for example, flat surfaces parallel to each other. The stacked body 3 is, for example, a semiconductor stacked body formed on the first main surface 2*a* by crystal growth along the Z direction (direction perpendicular to the first main surface 2*a*). For this crystal growth, for example, a metal organic chemical vapor deposition (MOCVD) method or a molecular beam epitaxy (MBE) method is used.

The stacked body 3 has a buffer layer 31, a first optical guide layer 32, an active layer 33, a second optical guide layer 34, and a contact layer 35. The buffer layer 31, the first optical guide layer 32, the active layer 33, the second optical guide layer 34, and the contact layer 35 are stacked on the first main surface 2*a* of the semiconductor substrate 2 in this order. That is, the contact layer 35 is arranged on a side opposite to the semiconductor substrate 2 (lower side in FIG. 3) with respect to the active layer 33. Each of the first optical guide layer 32 and the second optical guide layer 34 is, for example, one layer, but may be configured to include a plurality of layers.

The active layer 33 has a quantum well structure or a quantum dot structure. The active layer 33 has, for example, a triple quantum well structure in which three quantum well layers and two barrier layers are alternately arranged. In the active layer 33, an optical gain is generated by current application (carrier injection) through the first electrode 4 and the second electrode 5.

The stacked body 3 is configured as a ridge structure (protruding structure) on the semiconductor substrate 2. More specifically, a pair of groove portions 6 extending along the Y direction are formed in the stacked body 3, and the stacked body 3 has a ridge portion R extending along the Y direction between the pair of groove portions 6. The width of the ridge portion R in the X direction is about 2 μm to 5 μm. The groove portion 6 is formed by, for example, etching. The groove portion 6 is formed so as to reach the buffer layer 31 in the Z direction. The groove portion 6 has a side surface 6*a* and a bottom surface 6*b*. For example, the side surface 6*a* extends in a plane shape so as to be perpendicular to the X direction, and the bottom surface 6*b* extends in a plane shape so as to be perpendicular to the Z direction. The active layer 33 in the ridge portion R extends along the Y direction, and is formed so as to reach both side surfaces of the ridge portion R in the X direction.

The first electrode 4 is formed on the stacked body 3 so as to be in contact with the contact layer 35. More specifically, an insulating film 7 formed of, for example, SiNx is formed on the stacked body 3. The insulating film 7 covers the side surface 6*a* and the bottom surface 6*b* of the groove portion 6 and a portion of the stacked body 3 located further outward than the groove portion 6, but does not cover the top surface (surface 35*a* of the contact layer 35 on a side opposite to the semiconductor substrate 2) of the ridge portion R. The first electrode 4 is formed over the insulating film 7. In addition, the first electrode 4 extends so as to cover an outer edge portion 35*b* of the contact layer 35 but not cover a part 350 on the central side of the contact layer 35, and is in contact with the surface 35*a* of the contact layer 35 at the outer edge portion 35*b*. The outer edge portion 35*b* is an outer edge portion of the contact layer 35 in the ridge portion R, and is an outer edge portion in the X direction. The part 350 is a portion located further inward than the outer edge portion 35*b*. The first electrode 4 is formed of a metal material, such as Ti/Au (titanium/gold), Cr/Au (chromium/gold), and Ti/Pt/Au (titanium/platinum/gold). As an example, the first electrode 4 has a first layer formed of Ti and a second layer formed of Au, and the first layer is in contact with the contact layer 35.

A light transmitting portion 36 is formed in the stacked body 3 because the part 350 of the surface 35*a* of the contact layer 35 is not covered by the first electrode 4. In the light transmitting portion 36, the part 350 of the surface 35*a* is in contact with air (outside air) and is exposed to the outside, so that light can transmit through the part 350. On the other hand, the outer edge portion 35*b* of the contact layer 35 is covered with the first electrode 4, so that light cannot transmit through the outer edge portion 35*b*. The light transmitting portion 36 is provided so that the entire light transmitting portion 36 overlaps the active layer 33 when viewed from the Z direction.

The second electrode 5 is formed on the second main surface 2*b*. For example, the second electrode 5 is formed so as to cover the entire second main surface 2*b*. The second electrode 5 is formed of a metal material, such as AuGe/Au (eutectic of gold and germanium/gold) and AuGe/Ni/Au (eutectic of gold and germanium/nickel/gold). As an example, the second electrode 5 has a first layer formed of AuGe and a second layer formed of Au, and the first layer is in contact with the second main surface 2*b*.

A configuration example (crystal structure) of the optical semiconductor device 10 will be described with reference to FIG. 4. The following explanation will be given on the assumption that the semiconductor substrate 2 is a first region A1, the stacked body 3 is a second region A2, and a region (including a space) on one side (lower side in FIG. 3) in the Z direction from the surface 35*a* of the contact layer 35 is a third region A3. The configuration shown in FIG. 4 corresponds to a case where the wavelength of the light L is 1.55 μm.

Assuming that the thickness of each layer in the second region A2 is Ti and the refractive index of each layer is ni, the average refractive index n(2) of the entire second region A2 is defined as n(2)=(T1n1×T2n2× . . . )/(ΣTi). Assuming that the refractive indices of the first region A1 and the third region A3 are n(1) and n(3), respectively, the optical semiconductor device 10 is configured to satisfy n(2)>n(1)>n(3).

The semiconductor substrate 2 is formed of Si-InP, and has a thickness of 200 μm and a refractive index of 3.17. The semiconductor substrate 2 has an n-type polarity, and has a carrier concentration of 1.0E+18 ($1.0\times10^{18}$) ($cm^{-3}$).

The buffer layer 31 is configured in the same manner as the semiconductor substrate 2 except for the thickness. The buffer layer 31 has a thickness of 500 nm. The first optical guide layer 32 is formed of a material of Si-$(Al_{0.48}In_{0.52}As)_{0.55}/(Ga_{0.47}In_{0.53}As)_{0.45}$, and has a thickness of 50 nm and a refractive index of 3.17. The first optical guide layer 32 has an n-type polarity, and has a carrier concentration of 2.0E+17 ($cm^{-3}$).

The active layer 33 has a triple quantum well structure in which a first quantum well layer, a first barrier layer, a second quantum well layer, a second barrier layer, and a third quantum well layer are alternately arranged. The first quantum well layer is formed of Si-$(Ga_{0.47}In_{0.53}As)$, and has a thickness of 10 nm and a refractive index of 3.54. The first quantum well layer has an n-type polarity, and has a carrier concentration of 1.0E+17 ($cm^{-3}$). The first barrier layer is formed of Si-$(Al_{0.48}In_{0.52}As)_{0.55}/(Ga_{0.47}In_{0.53}As)_{0.45}$, and has a thickness of 10 nm and a refractive index of 3.30. The first barrier layer has an n-type polarity, and has a carrier concentration of 1.0E+17 ($cm^{-3}$). The second quantum well layer and the third quantum well layer are configured in the same manner as the first quantum well layer. The second barrier layer is configured in the same manner as the first barrier layer.

The second optical guide layer 34 is formed of Zn—$(Al_{0.48}In_{0.52}As)_{0.55}/(Ga_{0.47}In_{0.53}As)_{0.45}$, and has a thickness of 10 nm and a refractive index of 3.30. The second optical guide layer 34 has a p-type polarity, and a carrier concentration of 2.0E+17 ($cm^{-3}$).

The contact layer 35 is formed of Zn—$(Ga_{0.50\ to\ 0.48}In_{0.50\ to\ 0.52}As)$, and has a thickness of 100 nm and a refractive index of 3.56. The contact layer 35 has a p-type polarity, and has a carrier concentration of (5.0 to 20.0)E+18 ($cm^{-3}$).

In the Z direction (direction perpendicular to the first main surface 2*a*), the distance from the active layer 33 to the first main surface 2*a* of the semiconductor substrate 2 is longer than the distance from the active layer 33 to the contact layer 35. For example, in the case of the structure shown in FIG. 4, the distance from the active layer 33 to the first main surface 2*a* is 550 nm that is the sum of 500 nm, which is the thickness of the buffer layer 31, and 50 nm, which is the thickness of the first optical guide layer. On the other hand, the distance from the active layer 33 to the contact layer 35 is 10 nm that is the same as the thickness of the second optical guide layer 34.

The crystal structure of the optical semiconductor device 10 is not limited to the structure shown in FIG. 4. For example, the polarities of the semiconductor substrate 2 and the contact layer 35 may be opposite to each other. When the polarity of the semiconductor substrate 2 is p-type contrary to the above example, the polarity of the contact layer 35 may be n-type. The contact layer 35 is formed of the same material as the quantum well layer, that is, GaInAs, but the In composition of the contact layer 35 may be slightly smaller than that of the active layer 33 in order to suppress light absorption in the contact layer 35.

Figure 5:
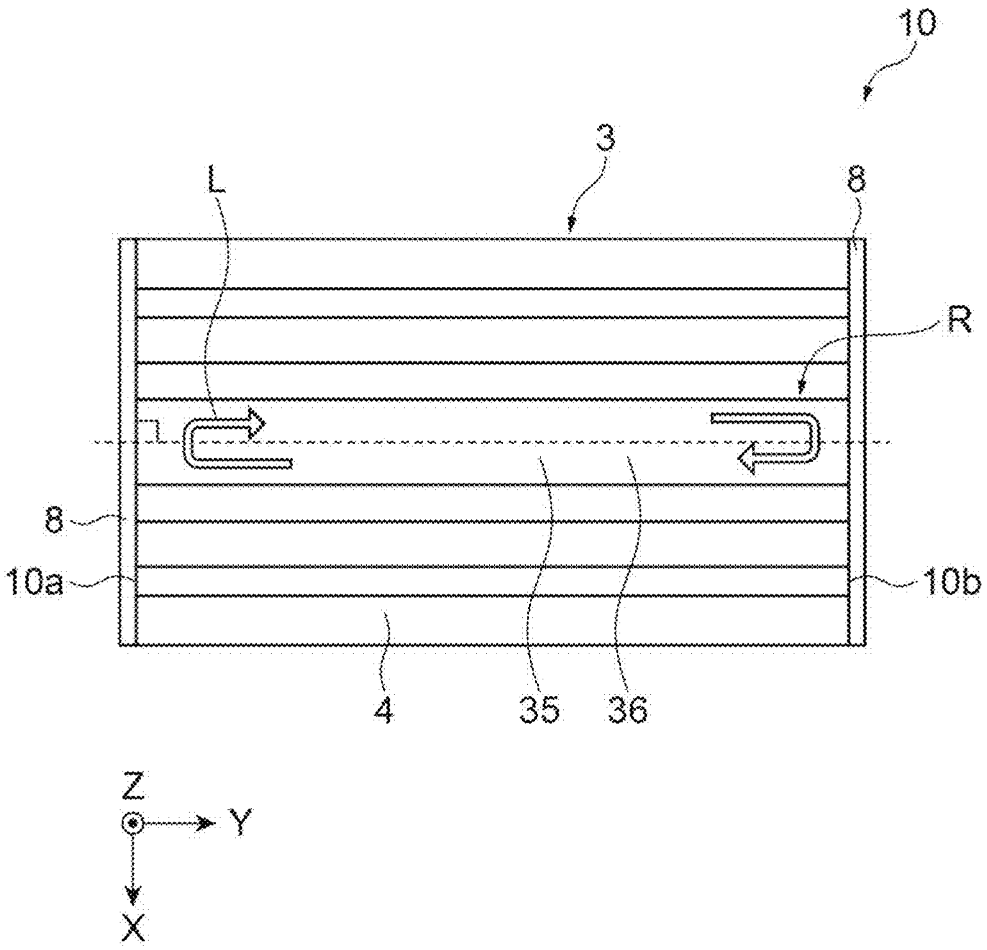
FIG. 5 is a plan view of the optical semiconductor device.

FIG. 5 is a plan view of the optical semiconductor device 10. As shown in FIG. 5, end surfaces (facets) 10*a* and 10*b* of the stacked body 3 in the Y direction are flat surfaces perpendicular to the Y direction (extending direction of the active layer 33 in the ridge portion R). The pair of end surfaces 10*a* and 10*b* are formed by, for example, cleavage. A high reflection film 8 is formed on each of the pair of end surfaces 10*a* and 10*b* over the entire surface. The high reflection film 8 is formed of, for example, $Al_2O_3$, $SiO_2$, $TiO_2$, or amorphous silicon, and is formed by, for example, evaporation.

In the present embodiment, since the high reflection film 8 having a high reflectance is formed, the reflectance at the end surfaces 10*a* and 10*b* is 80% or more. When the end surfaces 10*a* and 10*b* are not coated or the like, the reflectance of the end surfaces 10*a* and 10*b* is about 35%. In the present specification, high reflectance means a case where the reflectance is 35% or more (for example, 90% or more), and low reflectance means a case where the reflectance is less than 35%.

As will be described later, in a state in which the light transmitting portion 36 of the optical semiconductor device 10 is in optical contact with the waveguide member 50 and a current is applied through the first electrode 4 and the second electrode 5, a waveguide mode is formed in the optical semiconductor device 10. Then, as shown in FIG. 5, the light L generated in the active layer 33 propagates through the ridge portion R (light propagation portion) of the stacked body 3 along the Y direction, and is specularly reflected by the high reflection film 8 to reciprocate within the stacked body 3. Since this specular reflection is repeated to form an in-phase standing wave, laser light oscillates.

As described above, the light L from the optical semiconductor device 10 is introduced into the waveguide member 50 through the contact portion C. In the optical semiconductor device 10, there is a slight difference between the reflectances of the high reflection films 8 on the pair of end surfaces 10*a* and 10*b* in order to define a direction in which the introduced light L travels through the waveguide member 50. For example, by setting the reflectance of the high reflection film 8 on one end surface 10*a* to 95% and the reflectance of the high reflection film 8 on the other end surface 10*b* to 90%, the light L can be made to travel toward the other end surface 10*b* having a lower reflectance. [Waveguide member]

Figure 6:
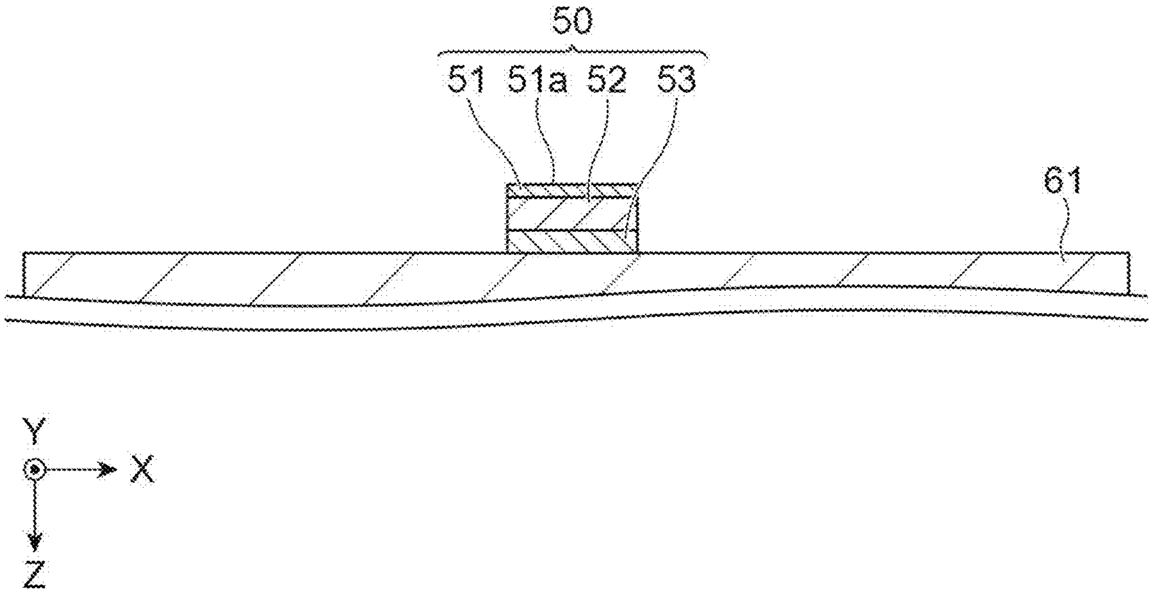
FIG. 6 is a cross-sectional view of a waveguide member.

As shown in FIG. 6, the waveguide member 50 includes a first clad layer 51, a core layer 52, and a second clad layer 53. The waveguide member 50 has a width and a thickness of about 0.2 μm to 0.8 μm. The width and thickness of the waveguide member 50 are set small so that the light L travels through the waveguide member 50 in a single mode. The width of the waveguide member 50 is narrower than the width of the contact layer 35 in the ridge portion R. In addition, the width of the waveguide member 50 is narrower than the width of the light transmitting portion 36 in the contact layer 35. In the above description, the width is the length in the X direction, and the thickness is the length in the Z direction.

The first clad layer 51, the core layer 52, and the second clad layer 53 are stacked in this order on the plate-shaped member 61 along the Z direction. The first clad layer 51 and the second clad layer 53 are formed of $SiO_2$, and the core layer 52 is formed of Si or silicon nitride (SiN). Each of the first clad layer 51 and the second clad layer 53 has a lower refractive index than the core layer 52. As shown in FIG. 2, the waveguide member 50 is in contact with the light transmitting portion 36 of the optical semiconductor device 10 on a surface 51*a* of the first clad layer 51. The surface 51*a* is a surface of the first clad layer 51 on a side opposite to the core layer 52. [Introduction of light from optical semiconductor device to waveguide member]

Figure 7B:
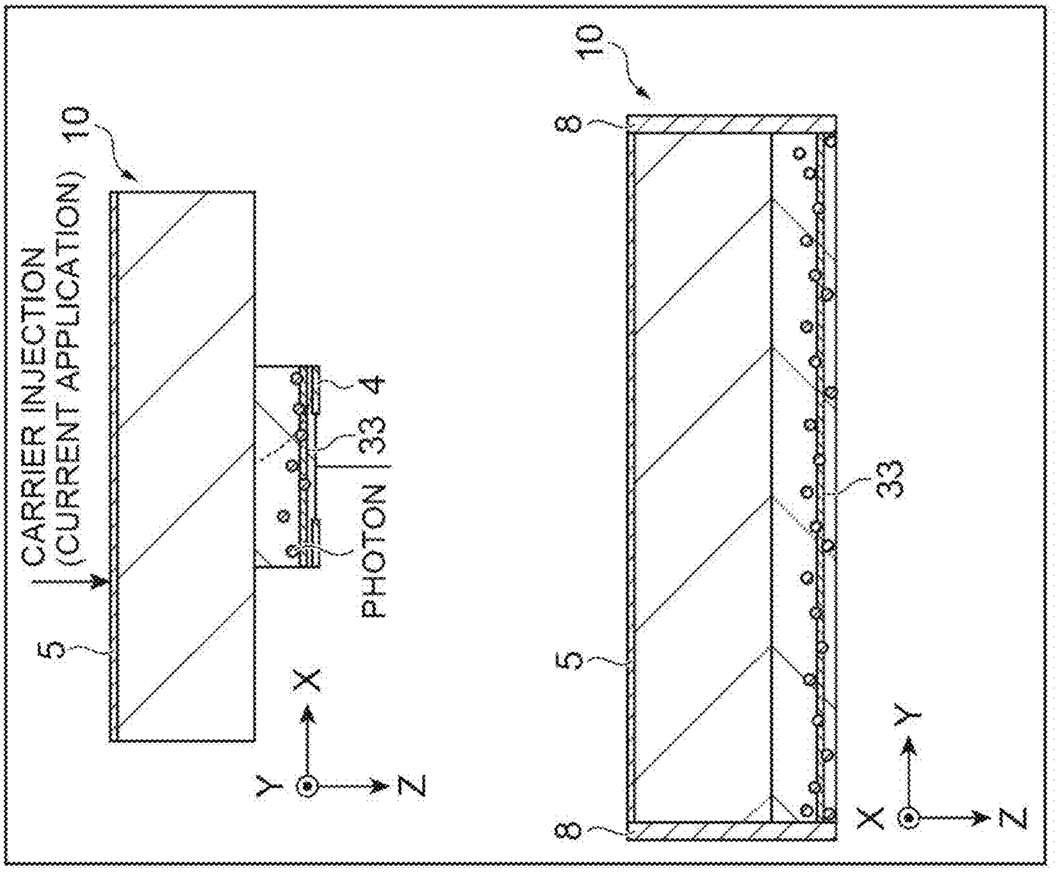
FIGS. 7A and 7B are cross-sectional views for explaining how light is introduced from the optical semiconductor device to the waveguide member.
Figure 7A:
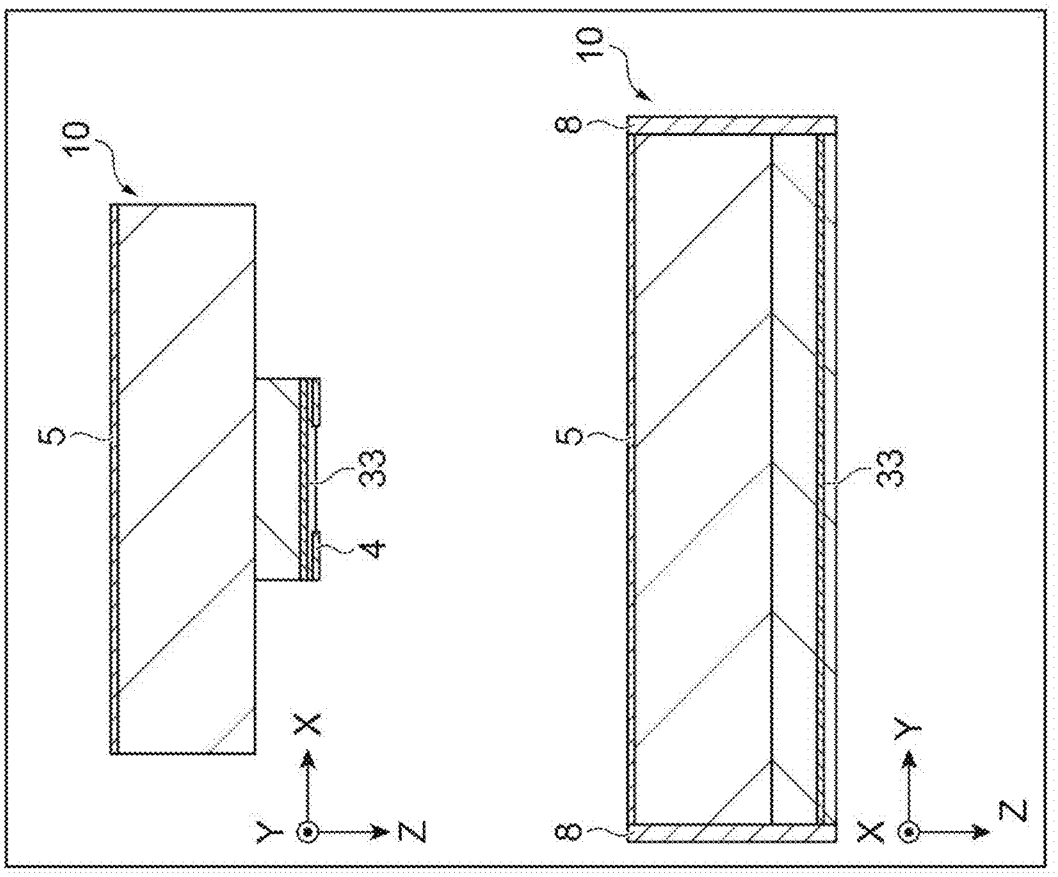

How light is introduced from the optical semiconductor device 10 to the waveguide member 50 will be described with reference to FIGS. 7A, 7B, 8A, and 8B. In each of FIGS. 7A to 8B, a cross section perpendicular to the Y direction is shown in the upper portion, and a cross section perpendicular to the X direction is shown in the lower portion. In FIGS. 7A to 8B, the arrow schematically shows a current path. FIG. 7A shows a state in which the optical semiconductor device 10 is not in optical contact with the waveguide member 50 (external member). FIG. 7B shows a state in which carrier injection (current application) through the first electrode 4 and the second electrode 5 is performed from the state shown in FIG. 7A. By the carrier injection, photons are generated in the active layer 33.

Figure 8A:
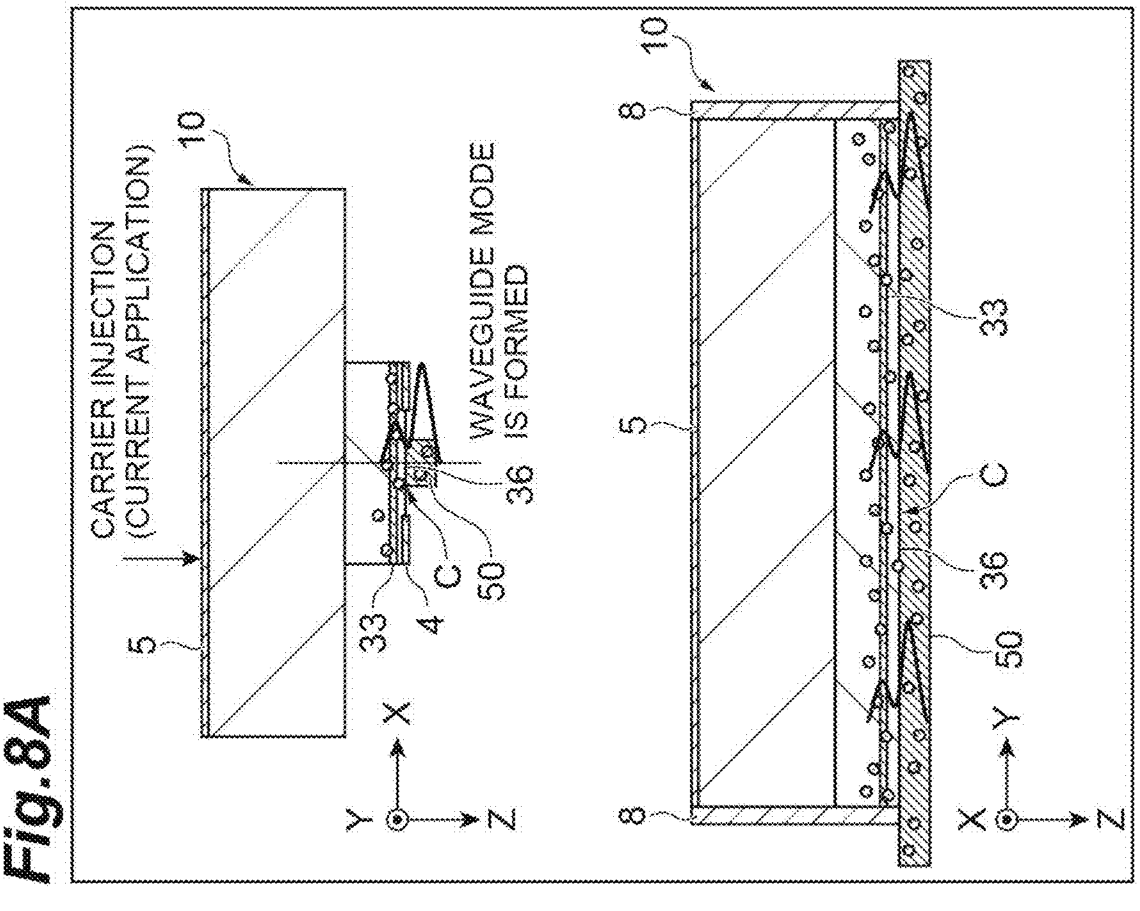
FIGS. 8A and 8B are cross-sectional views subsequent to FIGS. 7A and 7B for explaining how light is introduced from the optical semiconductor device to the waveguide member.
Figure 8B:
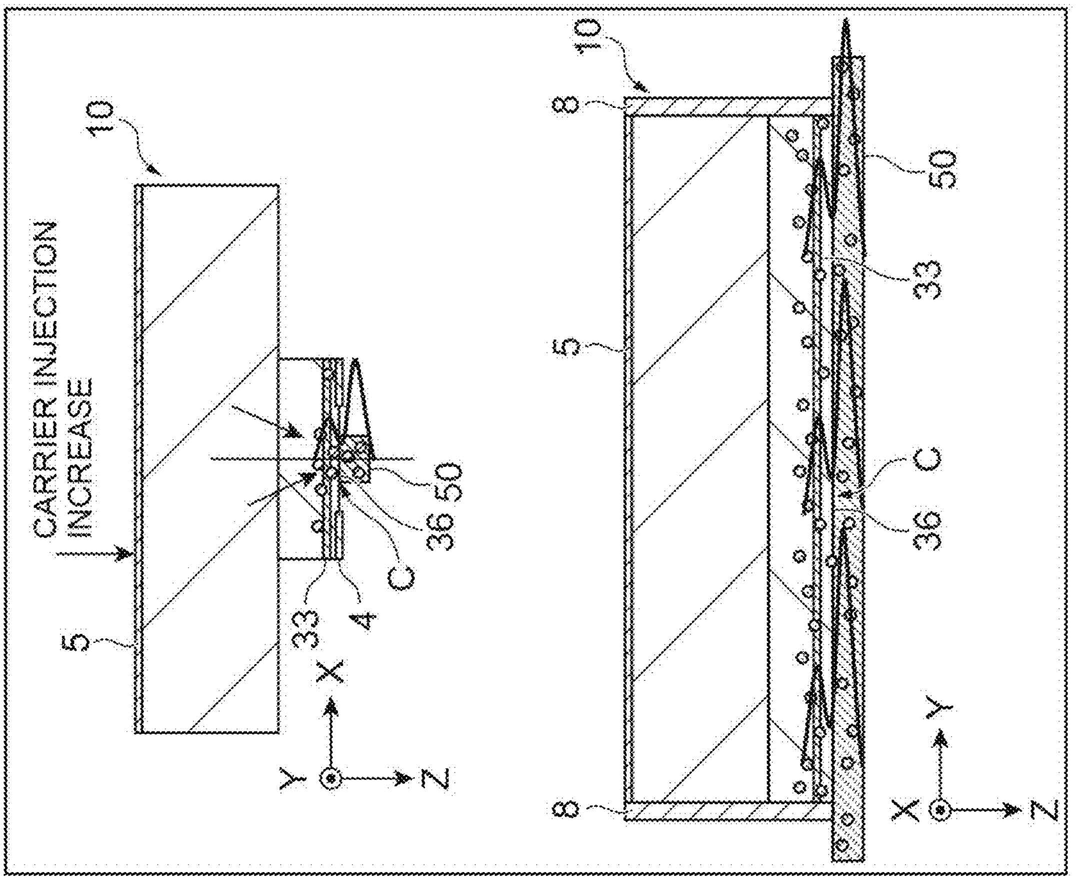

FIG. 8A shows a state in which the light transmitting portion 36 and the waveguide member 50 are optically brought into contact with each other from the state shown in FIG. 7B. By the optical contact between the light transmitting portion 36 and the waveguide member 50, a waveguide mode is formed in the optical semiconductor device 10 and a light introduction region is formed in the contact portion C, and the light L is introduced from the optical semiconductor device 10 to the waveguide member 50 through the contact portion C. FIG. 8B shows a state in which the amount of carrier injection is increased from the state shown in FIG. 8A. As shown in the upper portion of FIG. 8B, carrier consumption in the contact portion C increases, and a current concentrates in the contact portion C to supplement the consumed carriers. As a result, the current flowing through the contact portion C increases, and the light L also concentrates in the contact portion C.

Here, in a state in which the light transmitting portion 36 is not in contact with the waveguide member 50 (external member) (state shown in FIG. 7B), the optical semiconductor device 10 is configured such that a waveguide mode is not formed in the optical semiconductor device 10 by current application through the first electrode 4 and the second electrode 5. That is, even if the amount of current applied through the first electrode 4 and the second electrode 5 is increased, a waveguide mode is not formed in the optical semiconductor device 10. The waveguide mode corresponds to the light intensity distribution in the Z direction. It can be considered that a waveguide mode is formed when there is an eigenvalue that simultaneously satisfies the wave equation, which is a second-order differential equation, and the boundary continuity condition and no waveguide mode is formed when there is no eigenvalue. Whether or not a waveguide mode is formed is in an environment in which the optical semiconductor device 10 is normally used. For example, the applied current may be about 100 mA to 500 mA, and the operating temperature (environmental temperature) may be about 10° C. to 50° C.

The solution satisfying the wave equation is divided into a vibration solution expressed by a trigonometric function (Sin or Cos) and a damping solution expressed by an exponential function (Exp). In the case of the configuration example of FIG. 4 described above, a vibration solution is obtained for the second region A2, and a damping solution is obtained for the first region A1 and the third region A3.

The eigenvalue is a function of an equivalent refractive index Neff, and is obtained by an iterative method, which is one of the solutions to the eigenvalue problem, and the like. A known method can be used for the calculation and application of the equivalent refractive index. When the equivalent refractive index Neff is calculated, a waveguide mode is formed, and when the equivalent refractive index Neff is not calculated, no waveguide mode is formed. Since the eigenvalue has a polarization dependence, it is necessary to calculate the eigenvalue individually for the TE wave and the TM wave, but the calculation method is the same.

Figure 9:
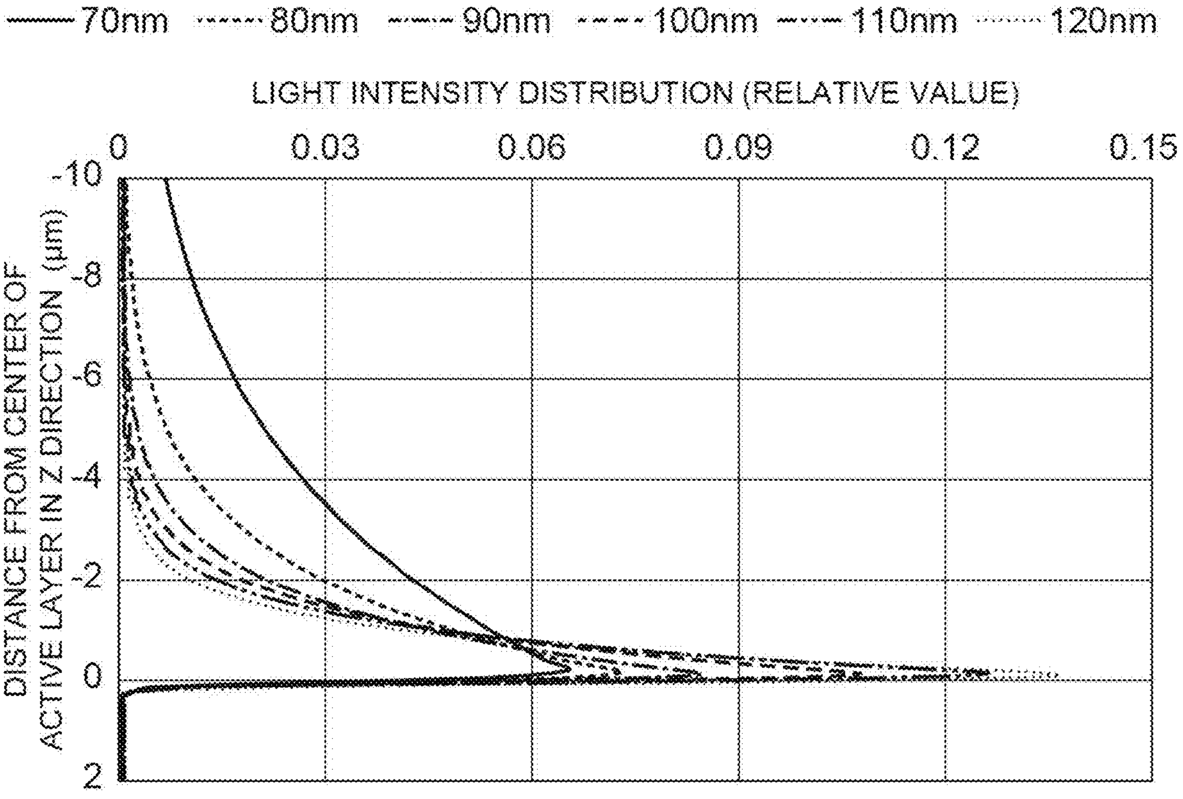
FIG. 9 is a graph for explaining a waveguide mode.

FIG. 9 shows an eigenvalue for the TE wave when the thickness of the first optical guide layer 32 is changed. In FIG. 9, the horizontal axis indicates the light intensity distribution (relative value), and the vertical axis indicates the distance (m) from the center of the active layer 33 along the Z direction. As the optical semiconductor device 10, one having the configuration example shown in FIG. 4 is used. The wavelength of the light L is 1.55 μm. As shown in FIG. 9, as the thickness of the first optical guide layer 32 decreases, the peak intensity in the waveguide mode decreases, and the amount of leakage to the semiconductor substrate 2 (first region A1) increases. When the first optical guide layer 32 is 50 nm, there is no eigenvalue. Therefore, no waveguide mode is formed.

Figure 10:
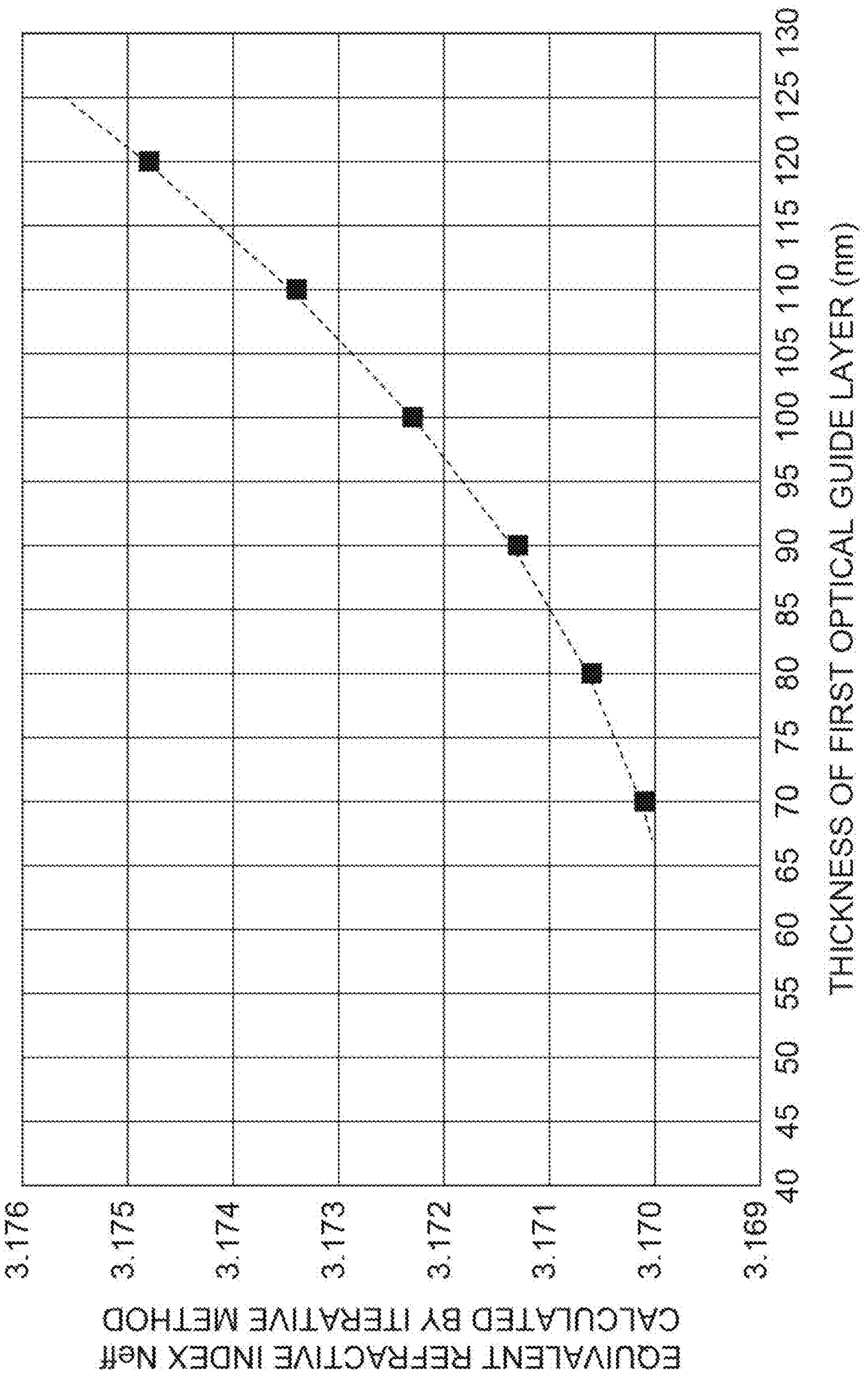
FIG. 10 is a graph for explaining a waveguide mode.

FIG. 10 is a diagram showing a state in which there is no eigenvalue from the viewpoint of the equivalent refractive index. In FIG. 10, the horizontal axis indicates the thickness (nm) of the first optical guide layer 32, and the vertical axis indicates the equivalent refractive index Neff calculated by the iterative method. As the thickness of the first optical guide layer 32 decreases, the calculated equivalent refractive index approaches the refractive index of 3.17 of the semiconductor substrate 2 (first region A1). This reflects the calculated waveguide mode, that is, how the amount of light intensity distribution leaking to the semiconductor substrate 2 increases. When the equivalent refractive index becomes equal to the refractive index of 3.17 of the semiconductor substrate 2, no waveguide mode is formed. In FIG. 10, the criticality is clear, and when the thickness of the first optical guide layer 32 is 65 nm or less, there is no eigenvalue and accordingly, no waveguide mode is formed.

While the waveguide mode when the thickness of the first optical guide layer 32 is changed with the configuration example of FIG. 4 as a reference has been described, the present disclosure is not limited to this example. Even when the thicknesses of other layers are changed or the respective layers are formed of different materials, it is possible to determine whether or not a waveguide mode is formed by using the same calculation method.

Figure 11:
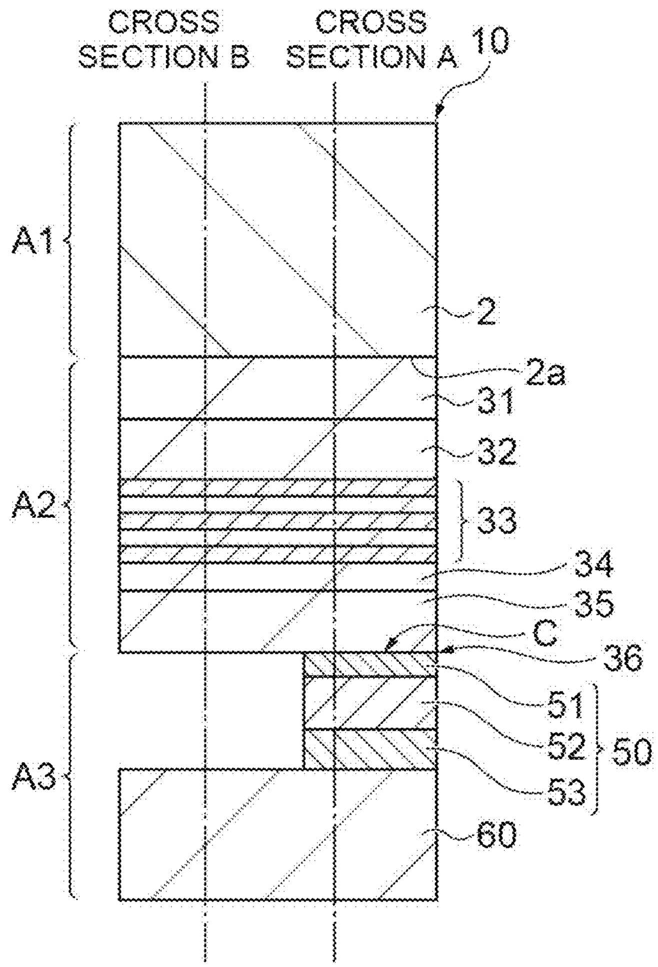
FIG. 11 is an enlarged cross-sectional view showing a contact portion between a light transmitting portion and a waveguide member.

The waveguide mode formation position and the current path in the optical semiconductor device 10 will be described with reference to FIGS. 11 to 14. FIG. 11 is a cross-sectional view showing the vicinity of the center of the optical semiconductor device 10 after the light transmitting portion 36 and the waveguide member 50 are in optical contact with each other. In FIG. 11, a cross section passing through the contact portion C between the light transmitting portion 36 and the waveguide member 50 and perpendicular to the first main surface 2*a* is defined as a cross section A (first cross section), and a cross section, which passes through the light transmitting portion 36 but does not pass through the contact portion C and which is perpendicular to the first main surface 2*a*, is defined as a cross section B (second cross section).

Figure 12A:
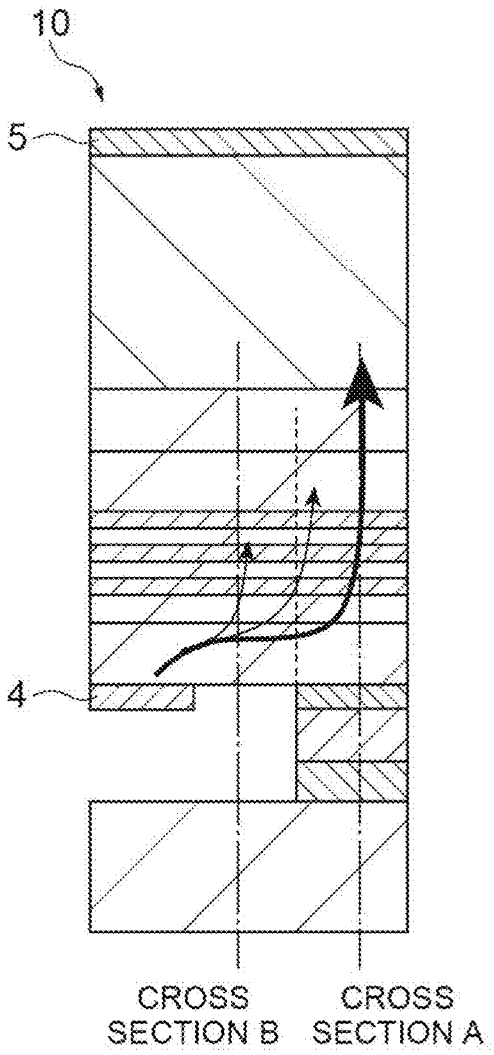
FIG. 12A is a cross-sectional view conceptually showing a current path in the embodiment.
Figure 12B:
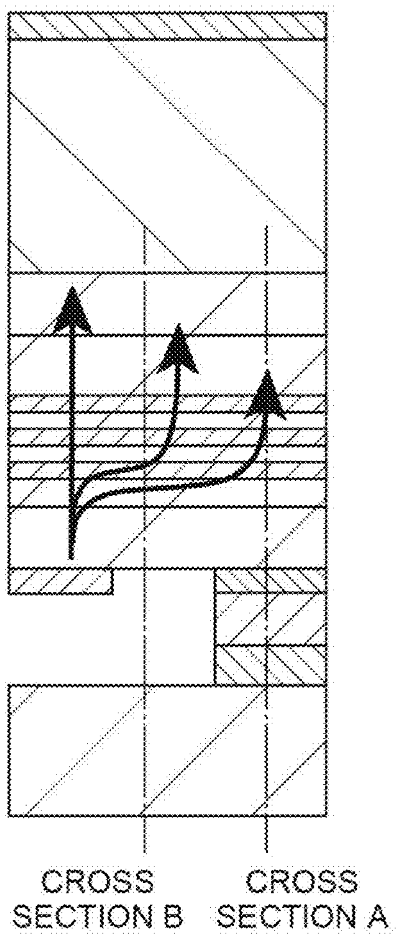
FIG. 12B is a cross-sectional view conceptually showing a current path in a reference example.

In FIGS. 12A and 12B, the arrow extending from the first electrode 4 schematically shows a current path, and the thickness of the arrow indicates the magnitude of the current. FIG. 12A shows an example in which a waveguide mode is formed in the cross section A and no waveguide mode is formed in the cross section B. As shown in FIG. 12A, when a region having a high light intensity distribution is formed only in the cross section A at the time of current application through the first electrode 4 and the second electrode 5, carriers are locally consumed. Therefore, the differential resistance in the cross section A is lower than that in the cross section B. That is, surrounding carriers gather in the region to supplement the consumed carriers. Since the current selectively flows through the region where the resistance is low, as the current increases, the current flowing through the cross section A increases, and the light also concentrates on the cross section A.

FIG. 12B shows an example in which a waveguide mode is formed in both the cross section A and the cross section B. In this example, since the contrast of the light intensity distribution between the cross section A and the cross section B is small, the difference in the differential resistance is unlikely to occur. Therefore, a state in which the current selectively flows directly above the waveguide member 50 does not occur.

Figure 13:
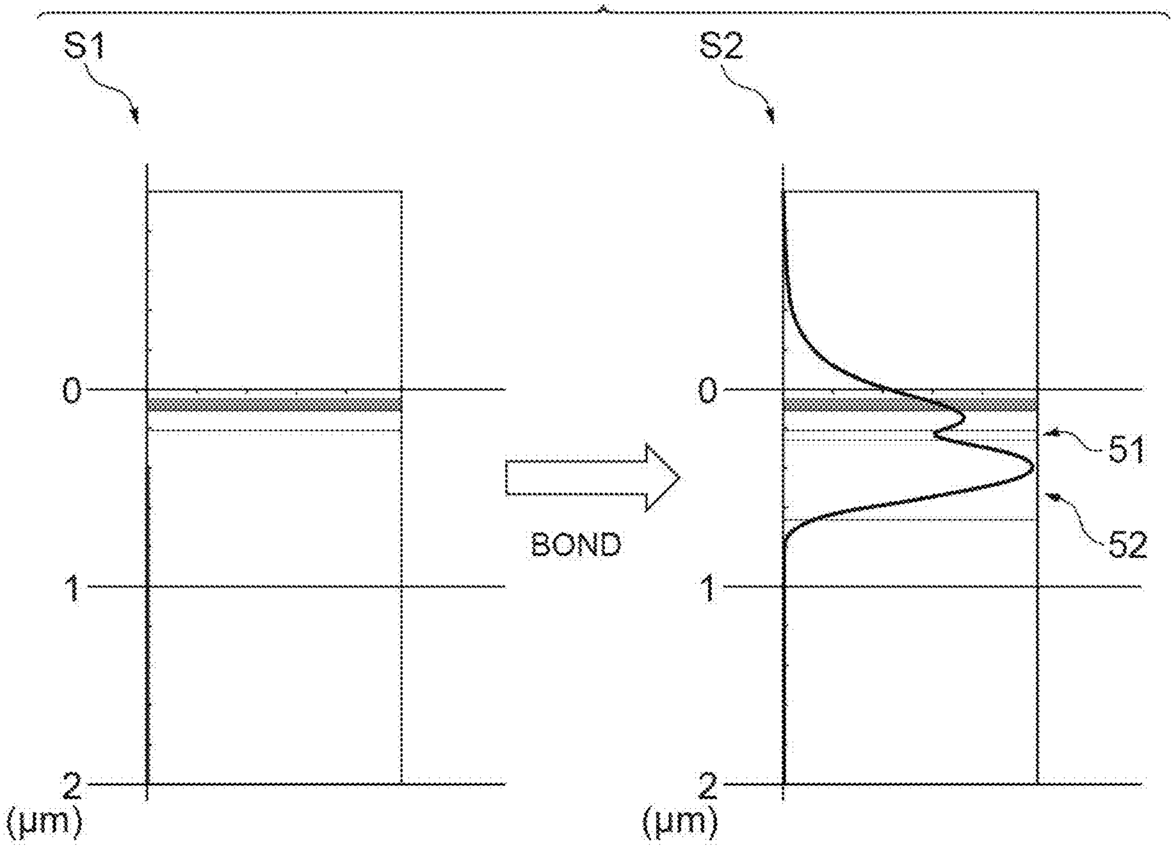
FIG. 13 is a diagram showing an example of whether or not a waveguide mode is formed depending on the thickness of a first optical guide layer.

FIG. 13 shows the calculation result of a waveguide mode for the configuration example of FIG. 4. As described above, the thickness of the first optical guide layer 32 is 50 nm. No waveguide mode is formed in a state 51 before the light transmitting portion 36 and the waveguide member 50 are in optical contact with each other, and a waveguide mode having two peaks is formed in a state S2 after the light transmitting portion 36 and the waveguide member 50 are in optical contact with each other.

Figure 14:
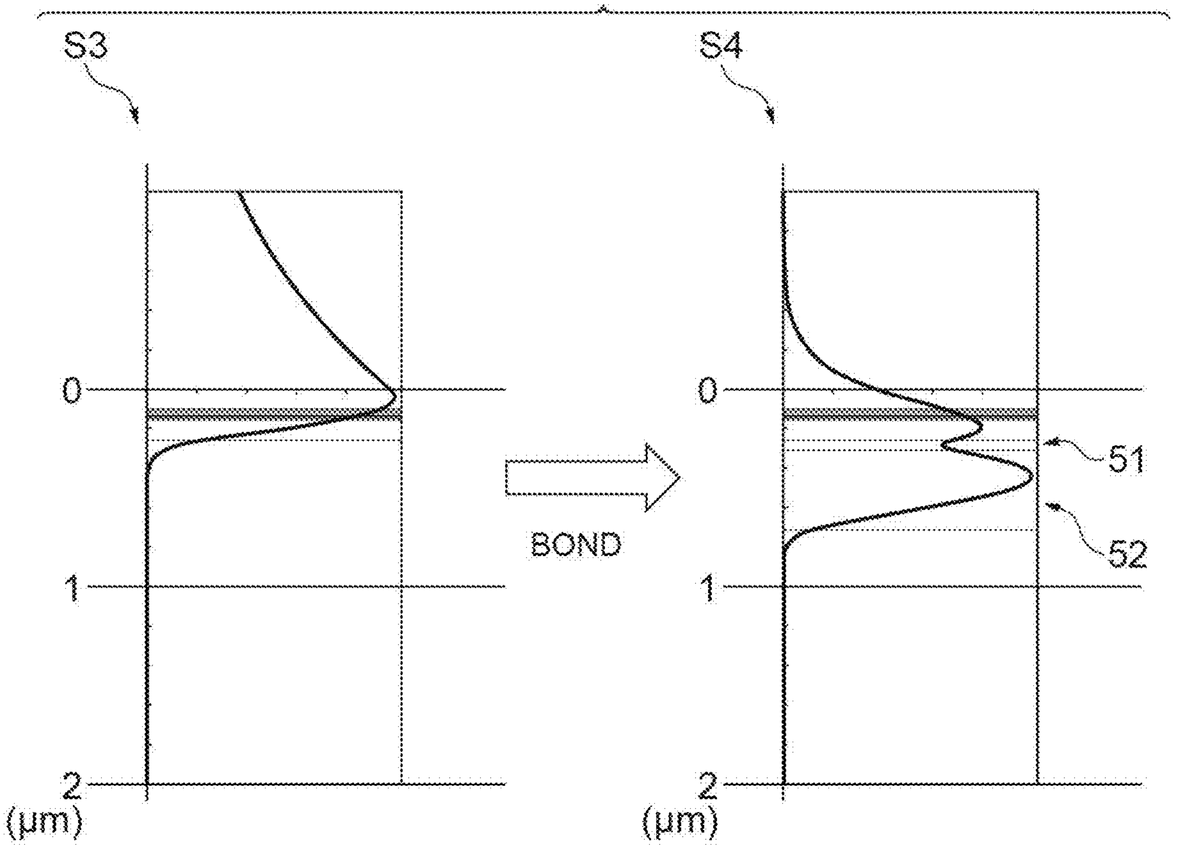
FIG. 14 is a diagram showing an example of whether or not a waveguide mode is formed depending on the thickness of a first optical guide layer.

FIG. 14 shows the calculation result of a waveguide mode when the thickness of the first optical guide layer 32 is 100 nm in the configuration example of FIG. 4. In a state S3 before the light transmitting portion 36 and the waveguide member 50 are in optical contact with each other, a waveguide mode having one peak is formed. In a state S4 after the light transmitting portion 36 and the waveguide member 50 are in optical contact with each other, a waveguide mode having two peaks is formed. In addition, in the state S4 after the light transmitting portion 36 and the waveguide member 50 are in optical contact with each other, a waveguide mode is formed in both the cross section A and the cross section B.

Functions and Effects

In the optical semiconductor device 10, the stacked body 3 has the light transmitting portion 36 formed by not covering at least the part 350 of the surface 35*a* of the contact layer 35 on a side opposite to the semiconductor substrate 2 with the first electrode 4. Therefore, for example, by bringing the waveguide member 50 into optical contact with the light transmitting portion 36, the optical semiconductor device 10 and the waveguide member 50 can be brought into optical contact with each other. In addition, the optical semiconductor device 10 is configured such that a waveguide mode is not formed by current application through the first electrode 4 and the second electrode 5 in a state in which the light transmitting portion 36 is not in optical contact with an external member (for example, the waveguide member 50). On the other hand, in a state in which the light transmitting portion 36 is in optical contact with an external member, a waveguide mode is formed by current application through the first electrode 4 and the second electrode 5. Therefore, for example, when the waveguide member 50 is in optical contact with the light transmitting portion 36 in a state in which a current is applied through the first electrode 4 and the second electrode 5, a large amount of carriers are consumed to reduce the differential resistance in the contact portion C between the light transmitting portion 36 and the waveguide member 50, so that the current concentrates in the contact portion C. As a result, a current path is formed in a portion of the stacked body 3 directly above the contact portion C, and the light L from the optical semiconductor device 10 is introduced into the waveguide member 50 in the contact portion C. Thus, when the optical semiconductor device 10 and the waveguide member 50 are assembled, a light introduction region is formed in the contact portion C by bringing the waveguide member 50 into contact with the light transmitting portion 36 of the optical semiconductor device 10. That is, the position of the introduction region of the light from the light transmitting portion 36 is determined according to the position of the waveguide member 50 (self-alignment). Therefore, for example, as compared with a case where a semiconductor laser having a predetermined light emitting region is bonded to the waveguide member 50 so that light is introduced with high efficiency, it is possible to reduce the accuracy required for assembly between the optical semiconductor device 10 and the waveguide member 50. As a result, it is possible to introduce the light into the waveguide member 50 easily and efficiently. As described above, according to the optical semiconductor device 10, the current path and the light introduction region can be made to overlap each other simply by arranging the optical semiconductor device 10 on the waveguide member 50. Therefore, since high assembly accuracy is not required, it is possible to improve the productivity. That is, the optical semiconductor device 10 is configured such that a waveguide mode is not formed by the device alone but is formed only when the optical semiconductor device 10 comes into contact with the waveguide member 50. In addition, in the field of silicon photonics, as a method of introducing light into a silicon waveguide, there are a method of introducing light by bringing a laser device directly close to the end surface of the silicon waveguide (edge fiber coupling method) and a method of providing a grating coupler on a silicon waveguide and introducing light from the grating coupler (grating fiber coupling method). However, both the methods require high-accuracy assembly technology and are time-consuming. On the other hand, as described above, according to the optical semiconductor device 10, it is possible to introduce the light into the waveguide member 50 easily and efficiently.

The stacked body 3 is configured as a ridge structure on the semiconductor substrate 2. Therefore, since the current density in the stacked body 3 can be increased, it is possible to increase the optical gain. That is, since a current confinement structure is realized by the current flowing only in the ridge portion R of the convex structure, it is possible to increase the current density.

The stacked body 3 has a pair of end surfaces 10*a* and 10*b* perpendicular to the Y direction (extending direction of the active layer 33), and the high reflection film 8 is formed on each of the pair of end surfaces 10*a* and 10*b*. Therefore, since the light leaking from the end surfaces 10*a* and 10*b* can be reduced, it is possible to further improve the efficiency. In addition, in the mounting of a normal semiconductor laser, there may be a problem that the solder adheres to the exit end surface due to the inflow or creeping up of the solder. However, in the optical semiconductor device 10, since the high reflection film 8 is formed on the end surfaces 10*a* and 10*b*, the emission of light from the end surfaces 10*a* and 10*b* is not intended. For this reason, such a problem is unlikely to occur.

In the Z direction (direction perpendicular to the first main surface 2*a*), the distance from the active layer 33 to the first main surface 2*a* is longer than the distance from the active layer 33 to the contact layer 35. Therefore, the optical semiconductor device 10 can be configured such that a waveguide mode is not formed by current application through the first electrode 4 and the second electrode 5 in a state in which the light transmitting portion 36 is not in optical contact with the waveguide member 50.

The optical semiconductor device 10 is configured as a semiconductor laser device. Therefore, the light L generated in the optical semiconductor device 10 can be introduced into the waveguide member 50.

In the light transmitting portion 36, the part 350 of the surface 35*a* of the contact layer 35 is exposed to the outside. Therefore, it is possible to suppress the degradation of the polarization characteristics due to the excessive stress applied to the optical semiconductor device 10. The entire light transmitting portion 36 overlaps the active layer 33 in the ridge portion R when viewed from the Z direction. Therefore, since it is possible to secure a wide range of contact with the waveguide member 50 in the light transmitting portion 36, it is possible to further simplify the introduction of light into the waveguide member 50.

The width of the waveguide member 50 is narrower than the width of the contact layer 35 in the ridge portion R. When the width of the waveguide member 50 is narrow as described above, assembly between the optical semiconductor device 10 and the waveguide member 50 is difficult. However, according to the optical unit 1, even in such a case, light can be easily introduced into the waveguide member 50. [Method for manufacturing optical unit]

Figure 15A:
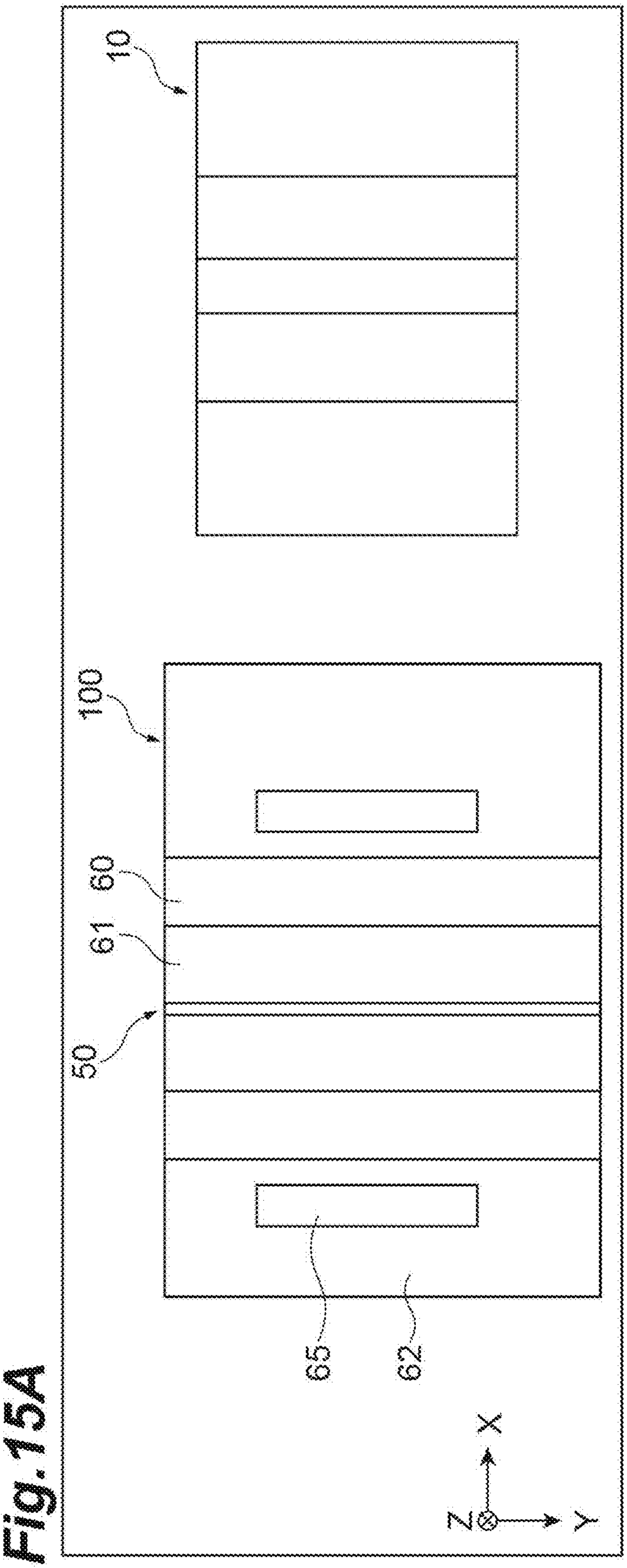
FIGS. 15A and 15B are diagrams for explaining a method for manufacturing an optical unit, where
Figure 15B:
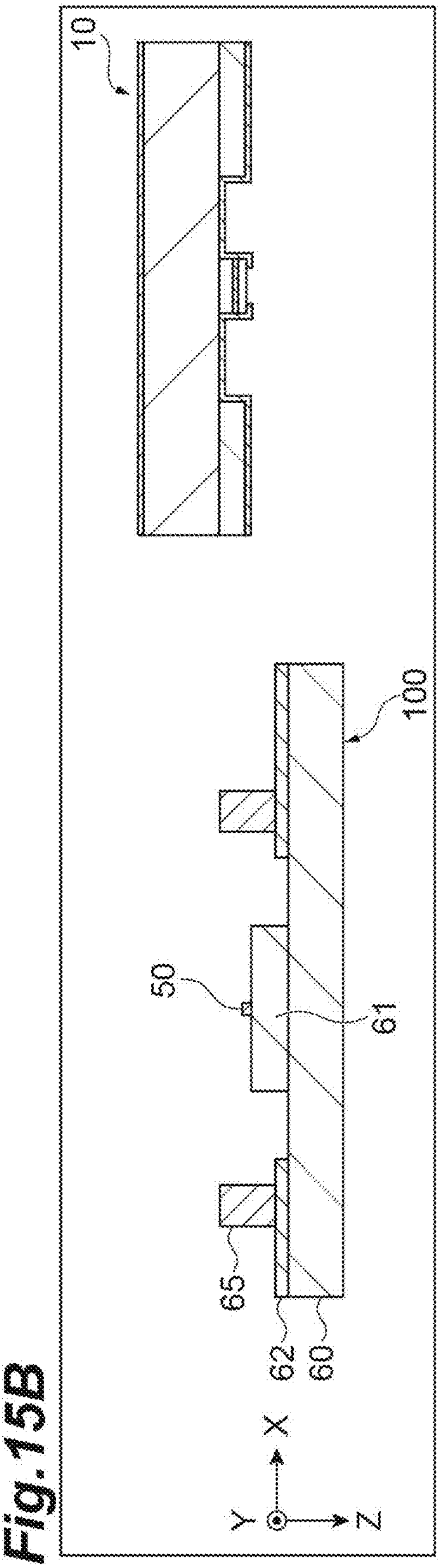
Figure 16A:
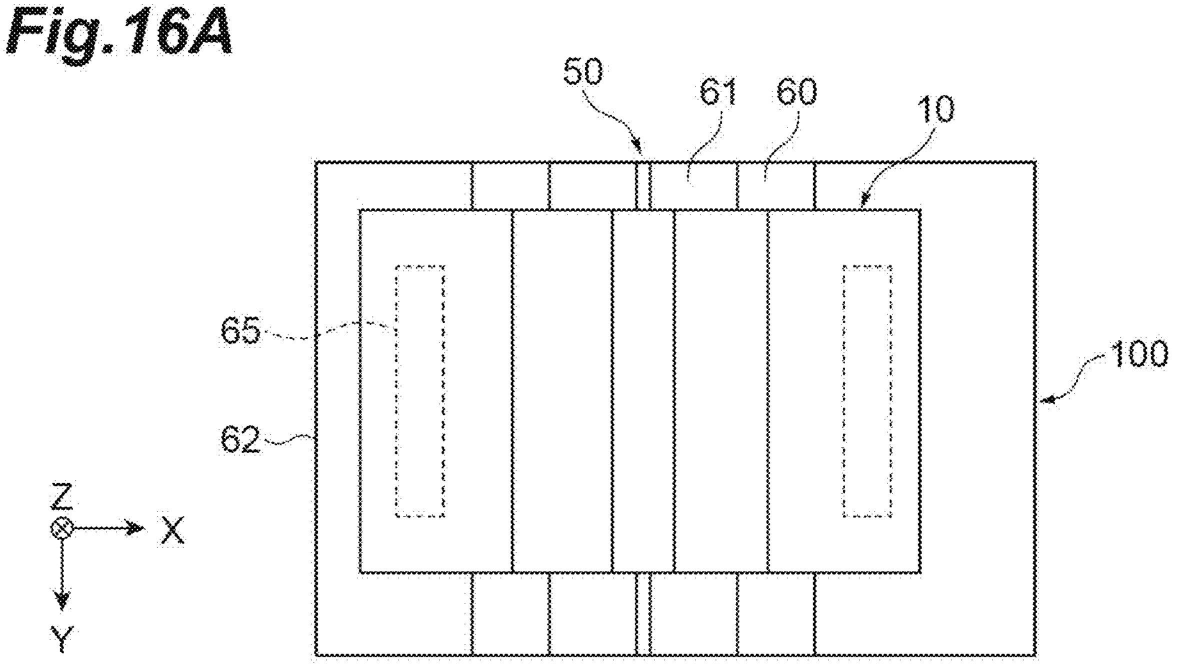
FIGS. 16A and 16B are diagrams for explaining a method for manufacturing an optical unit, where
Figure 16B:
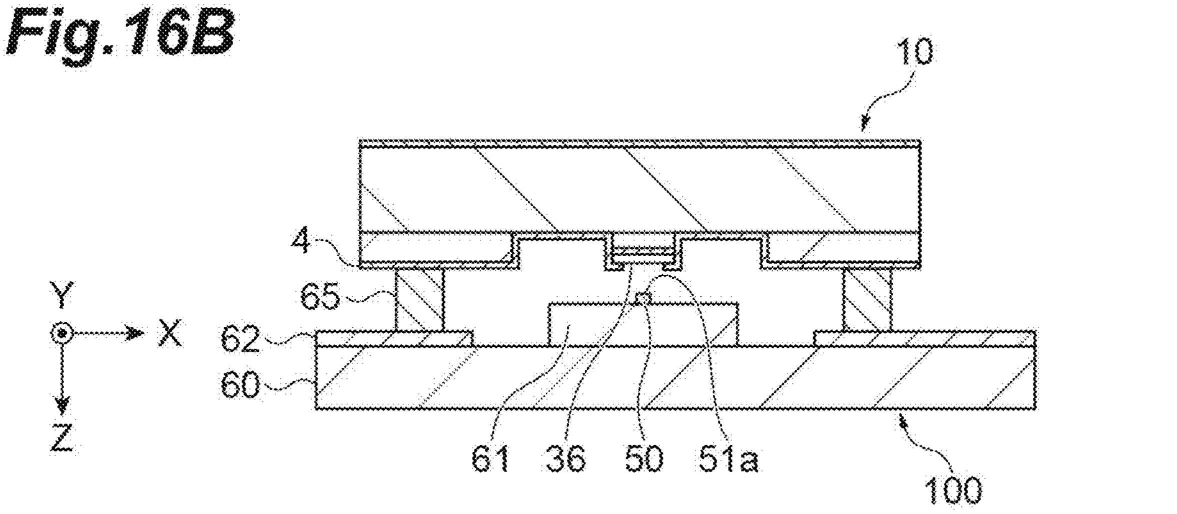
Figure 17A:
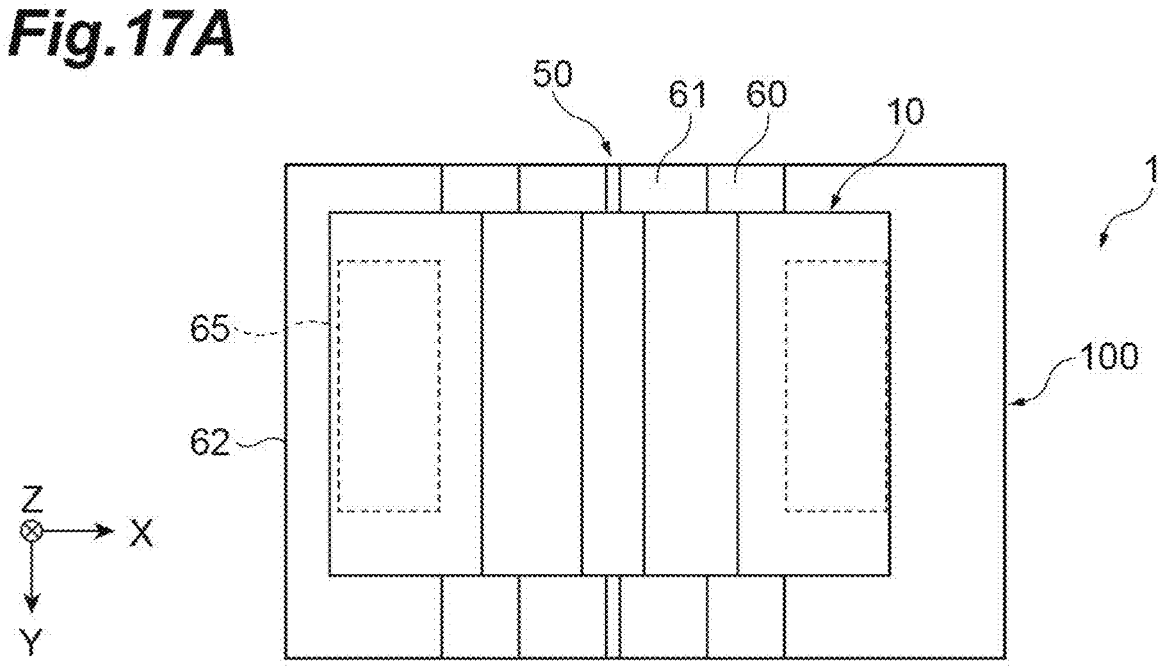
FIGS. 17A and 17B are diagrams for explaining a method for manufacturing an optical unit, where
Figure 17B:
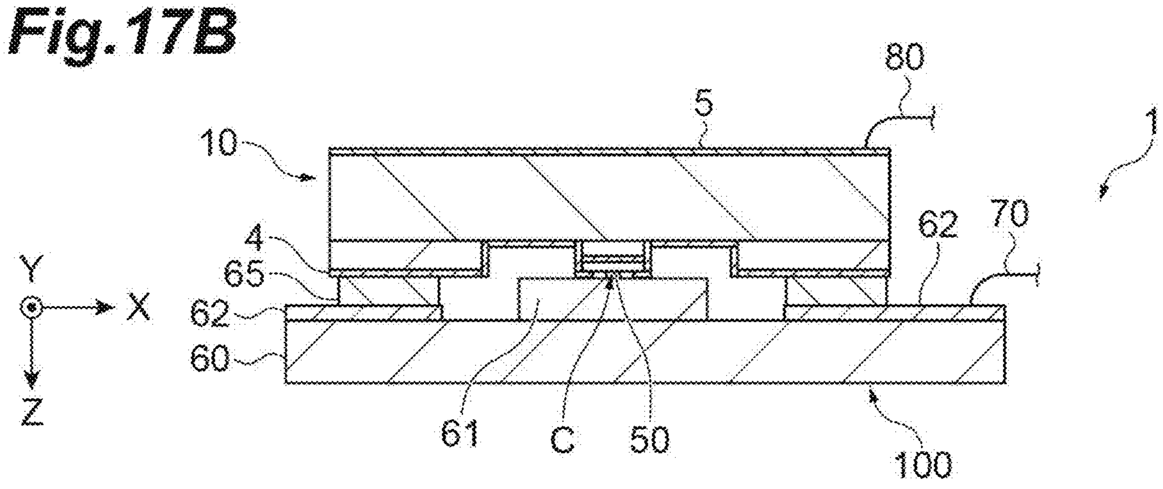
Figure 18:
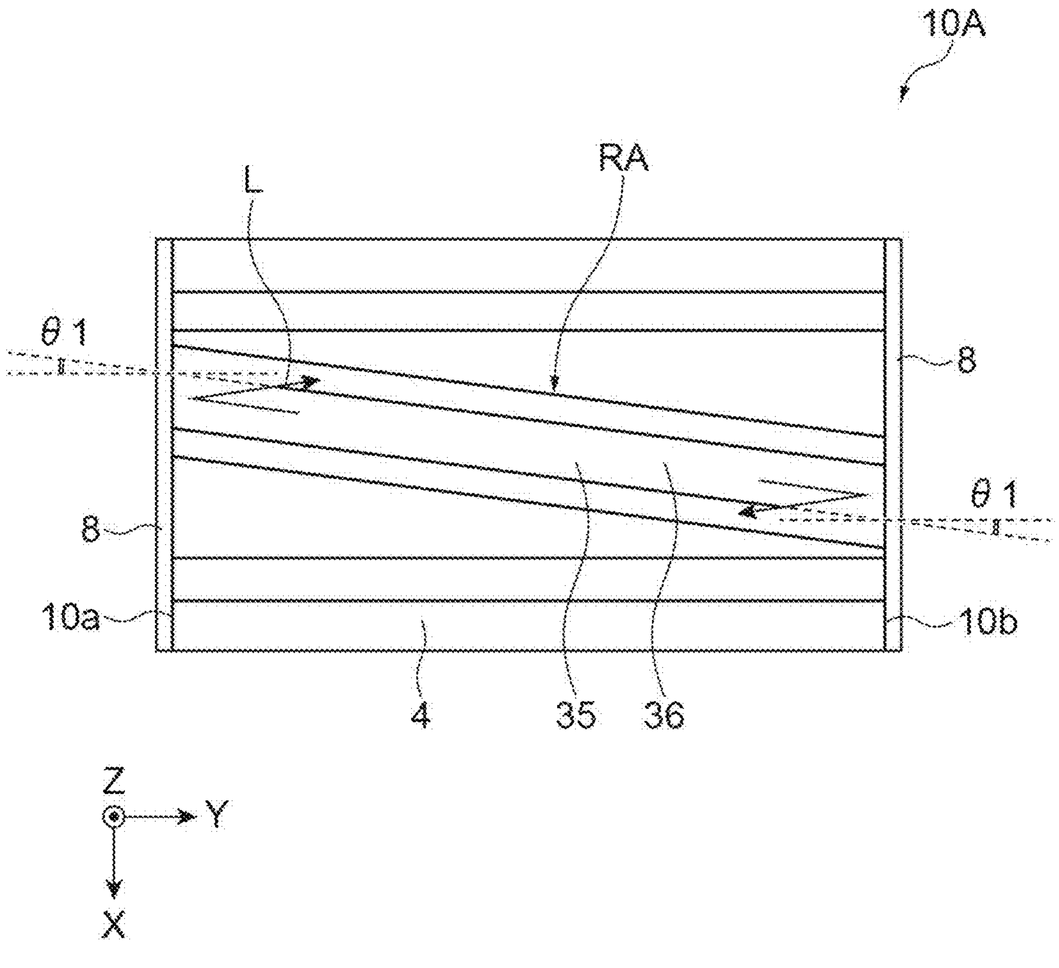
FIG. 18 is a plan view of an optical semiconductor device according to a modification example.
Figure 19:
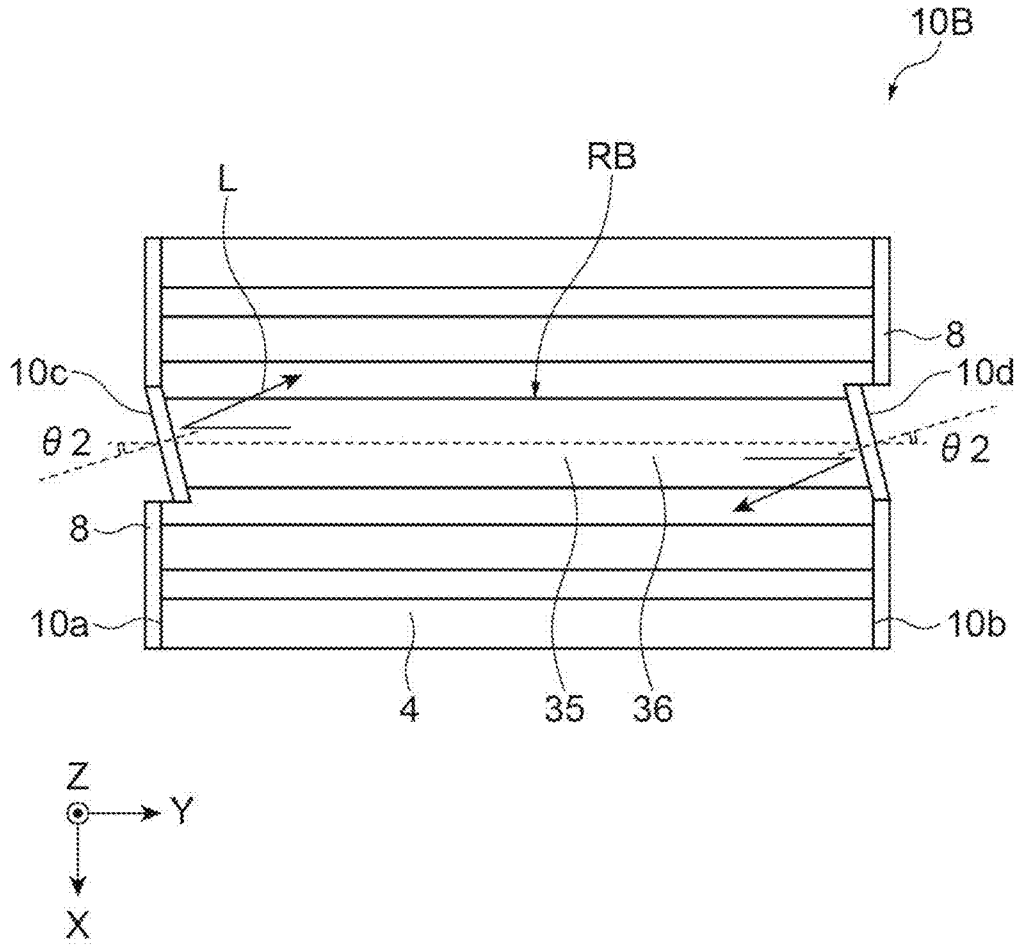
FIG. 19 is a plan view of an optical semiconductor device according to a modification example.
Figure 20:
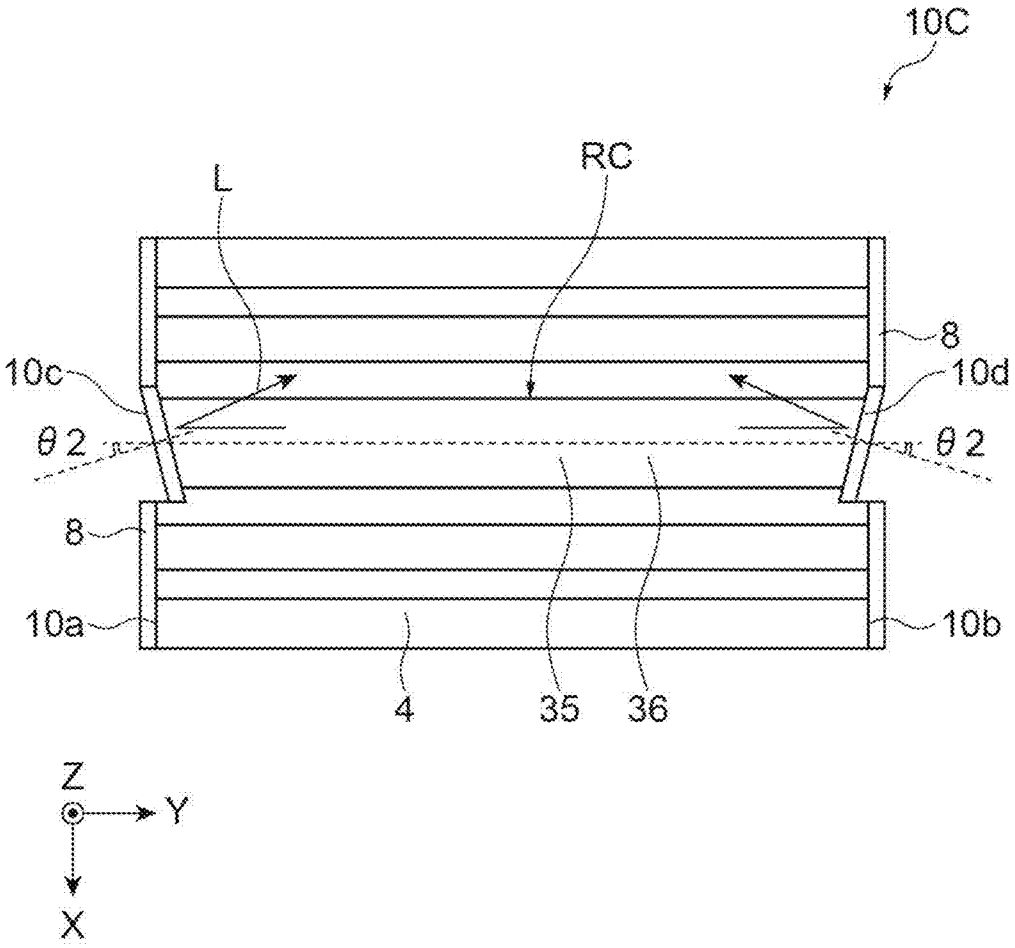
FIG. 20 is a plan view of an optical semiconductor device according to a modification example.
Figure 21:
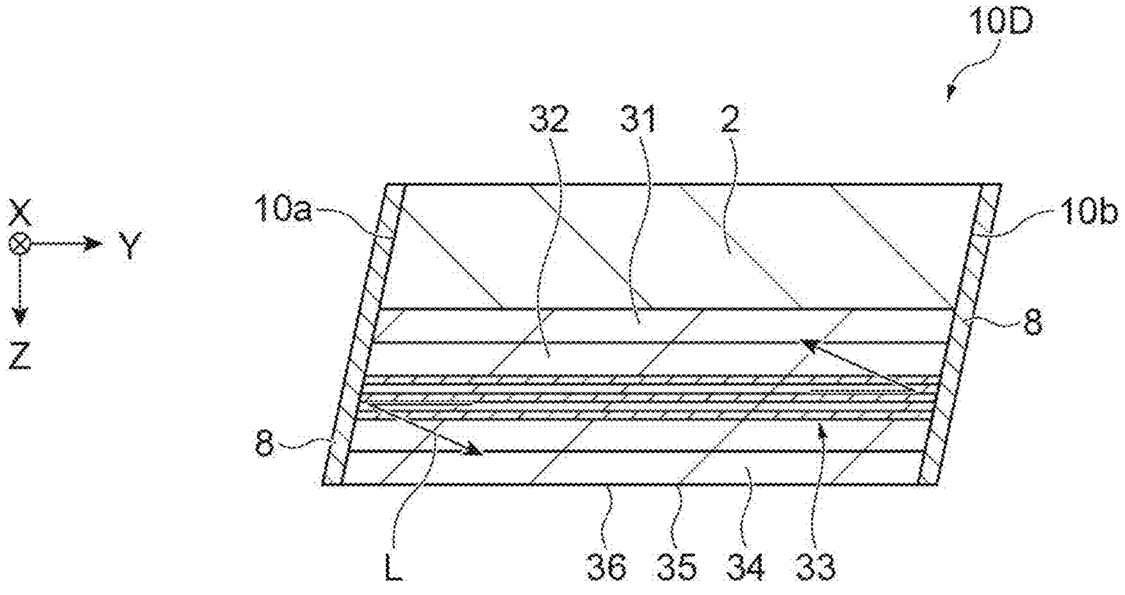
FIG. 21 is a plan view of an optical semiconductor device according to a modification example.

An example of a method for manufacturing the optical unit 1 will be described with reference to FIGS. 15A to 17B. FIGS. 15A, 16A, and 17A are plan views, and FIGS. 15B, 16B, and 17B are cross-sectional views along a plane perpendicular to the Y direction. First, as shown in FIGS. 15A and 15B, the optical semiconductor device 10 and the waveguide unit 100 are prepared (first step). In the first step, the waveguide unit 100 in which the fixing material (solder) 65 is formed on each electrode 62 is prepared.

Subsequently, the optical semiconductor device 10 and the waveguide member 50 are fixed to each other in a state in which the light transmitting portion 36 of the optical semiconductor device 10 and the waveguide member 50 are in optical contact with each other (second step). More specifically, in the second step, the optical semiconductor device 10 and the substrate 60 are fixed to each other and the optical semiconductor device 10 and the waveguide member 50 are bonded to each other, thereby fixing the optical semiconductor device 10 and the waveguide member 50 to each other. In the second step, first, as shown in FIGS. 16A and 16B, the optical semiconductor device 10 is arranged on the waveguide unit 100 so that the first electrode 4 comes into contact with the fixing material 65. At this time, the light transmitting portion 36 faces the surface 51*a* of the first clad layer 51.

Subsequently, as shown in FIGS. 17A and 17B, the fixing material 65 is heated and accordingly, the fixing material 65 is melted to make the optical semiconductor device 10 on the fixing material 65 move (descend) along the Z direction. Then, the light transmitting portion 36 and the surface 51*a* of the first clad layer 51 come into contact with each other, so that the movement is stopped. As a result, the light transmitting portion 36 (contact layer 35) and the first clad layer 51 (waveguide member 50) are bonded to each other.

In addition, the first electrode 4 and the electrode 62 are fixed by melting and solidifying the fixing material 65.

The contact layer 35 and the waveguide member 50 are fixed to each other by using hydrophilic bonding or plasma-activated bonding. In the hydrophilic bonding, the surface 35*a* of the contact layer 35 and the surface 51*a* of the first clad layer 51 are cleaned to remove the oxide film, particles, and the like, and then the surfaces 35*a* and 51*a* are hydrophilized. In the hydrophilization, OH groups are adsorbed on the surfaces 35*a* and 51*a* so that the OH groups are directly bonded to each other, thereby obtaining a state in which the two OH groups are bonded to each other. Then, water ($H_2O$) is desorbed by annealing at 200° C. to 400° C., and the remaining oxygen atoms are bonded as glue. In the plasma-activated bonding, after surface cleaning similar to that in the hydrophilic bonding, two surfaces facing each other are activated by emitting plasma between the surfaces to be bonded to each other. Thereafter, the surfaces are directly bonded to each other.

When bonding using the fixing material 65 and hydrophilic bonding are performed as in this example, for example, after cleaning and hydrophilizing the surfaces 35*a* and 51*a*, the fixing material 65 is arranged on the electrode 62, and the optical semiconductor device 10 is arranged on the waveguide unit 100 so that the first electrode 4 comes into contact with the fixing material 65. Subsequently, each member is heated to 200° C. to 400° C. As a result, the hydrophilic bonding is completed by dehydration, and the fixing material 65 is melted. Thereafter, the fixing material 65 is cooled and solidified, so that the bonding using the fixing material 65 is completed.

After the second step, as shown in FIG. 17B, the wire 70 on the anode side is electrically connected to one electrode 62, and the wire 80 on the cathode side is electrically connected to the second electrode 5. The optical unit 1 is manufactured by the steps described above.

According to the method for manufacturing the optical unit 1, as described above, it is possible to reduce the accuracy required for assembly between the optical semiconductor device 10 and the waveguide member 50, so that it is possible to introduce the light into the waveguide member 50 easily and efficiently. In addition, in the second step, the optical semiconductor device 10 and the waveguide member 50 are fixed to each other by fixing the optical semiconductor device 10 and the substrate 60 to each other. Therefore, since the optical semiconductor device 10 and the substrate 60 are fixed to each other, it is possible to secure the fixing strength between the semiconductor device 10 and the waveguide member 50 regardless of the bonding strength between the light transmitting portion 36 of the optical semiconductor device 10 and the waveguide member 50. For example, the bonding strength between the light transmitting portion 36 and the waveguide member 50 by the above-described hydrophilic bonding or plasma-activated bonding is not high. However, in the optical unit 1, since the optical semiconductor device 10 and the substrate 60 are firmly fixed by the fixing member 65, the bonding strength between the light transmitting portion 36 and the waveguide member 50 is unlikely to be a problem.

Modification Examples

The present disclosure is not limited to the embodiment described above. In the above embodiment, an example in which the optical semiconductor device 10 is configured as a semiconductor laser device has been described. However, the optical semiconductor device 10 may be configured as a semiconductor optical amplifier (SOA). In this case, the light L amplified in the optical semiconductor device 10 can be introduced into the waveguide member 50. For example, the optical semiconductor device 10 can be configured as a semiconductor optical amplifier by suppressing specular reflection on the pair of end surfaces 10*a* and 10*b*. This is because by suppressing specular reflection, it becomes difficult to form an in-phase standing wave and accordingly, it becomes difficult to reach laser oscillation. When a high gain is obtained in the optical semiconductor device 10 due to an increase in the supplied current, laser oscillation may occur, but the oscillation threshold value is significantly increased. The semiconductor optical amplifier can be regarded as a laser device having a high oscillation threshold value. When the oscillation threshold current is sufficiently large for the practical drive current, it can be regarded that the optical semiconductor device 10 is configured as a semiconductor optical amplifier. For example, in the optical semiconductor device 10, a low reflection film may be formed on each of the end surfaces 10*a* and 10*b* instead of the high reflection film 8. The low reflection film is a film having a low reflectance. The reflectance of the low reflection film may be less than 35% as described above, but may be 5% or less. Since the low reflection film can suppress the oscillation of light in the stacked body 3, the optical semiconductor device 10 can function as a semiconductor optical amplifier. Even with such a modification example, it is possible to introduce the light into the waveguide member 50 easily and efficiently as in the embodiment described above.

FIGS. 18 to 21 are plan views of optical semiconductor devices 10A to 10D according to modification examples. The optical semiconductor devices 10A to 10D are configured as semiconductor optical amplifiers. The optical semiconductor device 10A is different from the optical semiconductor device 10 in that a ridge portion RA (the active layer 33 and the light transmitting portion 36) extends so as to be inclined with respect to the Y direction. Assuming that the inclination angles of the ridge portion RA with respect to the end surfaces 10*a* and 10*b* in the extending direction are θ1, θ1 is, for example, 3° to 20°, or may be 5° to 15°.

The optical semiconductor device 10B is different from the optical semiconductor device 10 in that a ridge portion RB has a pair of inclined surfaces 10*c* and 10*d*. The inclined surfaces 10*c* and 10*d* are inclined with respect to the Y direction. Assuming that the inclination angles of the inclined surfaces 10*c* and 10*d* with respect to the end surfaces 10*a* and 10*b* in the extending direction are θ2, θ2 is, for example, 20° or more, or may be 5° to 15°. The inclined surfaces 10*c* and 10*d* are formed by using, for example, a dry etching method. In the optical semiconductor device 10B, the inclined surfaces 10*c* and 10*d* are formed so as to be parallel to each other.

The optical semiconductor device 10C is different from the optical semiconductor device 10B in that the inclination directions of the inclined surfaces 10*c* and 10*d* of a ridge portion RC are different. In the optical semiconductor device 10C, the inclined surfaces 10*c* and 10*d* are formed so as not to be parallel to each other.

The optical semiconductor device 10D is different from the optical semiconductor device 10 in that the semiconductor substrate 2 is configured as an off-substrate and the end surfaces 10*a* and 10*b* extend so as to be inclined with respect to the Y direction. The off-substrate is a substrate formed by cutting both the end surfaces so as to be inclined by a predetermined angle (off-angle) with respect to the crystal growth direction (Z direction). The inclination angles of the end surfaces 10*a* and 10*b* with respect to the Y direction are, for example, 2° to 15°.

Even with these modification examples, it is possible to introduce the light into the waveguide member 50 easily and efficiently as in the embodiment described above. In addition, in the optical semiconductor devices 10A to 10D, the stacked body 3 has the end surfaces 10*a* and 10*b* or the inclined surfaces 10*c* and 10*d* that are inclined with respect to the extending direction of the active layer 33, and the high reflection film 8 is formed on each of the end surfaces 10*a* and 10*b* or each of the inclined surfaces 10*c* and 10*d*. Therefore, it is possible to make the optical semiconductor device 10 function as a semiconductor optical amplifier while reducing the light leaking from the end surfaces 10*a* and 10*b*.

When the end surfaces are inclined with respect to the traveling direction of the light L as in the optical semiconductor devices 10A to 10D, the light L does not reciprocate within the device and travels in only one direction. Therefore, by making the reflectances of the high reflection films 8 on both end surfaces slightly different as in the case of the embodiment described above, it is not necessary to define the direction in which the light L introduced into the waveguide member 50 travels through the waveguide member 50. On the other hand, when the optical semiconductor device 10 is configured as a semiconductor optical amplifier by providing a low reflection film on both the end surfaces as described above, the traveling direction of the light L can be defined by making the reflectances of the low reflection films on both the end surfaces slightly different. For example, by setting the reflectance of the low reflection film on one end surface 10*a* to 3% and the reflectance of the low reflection film on the other end surface 10*b* to 0.5%, the light L can be made to travel toward the other end surface 10*b* having a low reflectance.

The optical semiconductor device 10 can also be configured as a semiconductor optical amplifier by increasing the length of the optical semiconductor device 10 in the Y direction. This is because when the length of the optical semiconductor device 10 in the Y direction increases, the area to which the current is supplied increases and accordingly, the current density decreases, the optical gain decreases, and the oscillation threshold current increases. On the other hand, when the length of the optical semiconductor device 10 in the Y direction decreases, the area to which the current is supplied decreases and accordingly, the current density increases and the optical gain increases. In this case, the optical semiconductor device 10 can be configured as a semiconductor laser device.

Figure 22:
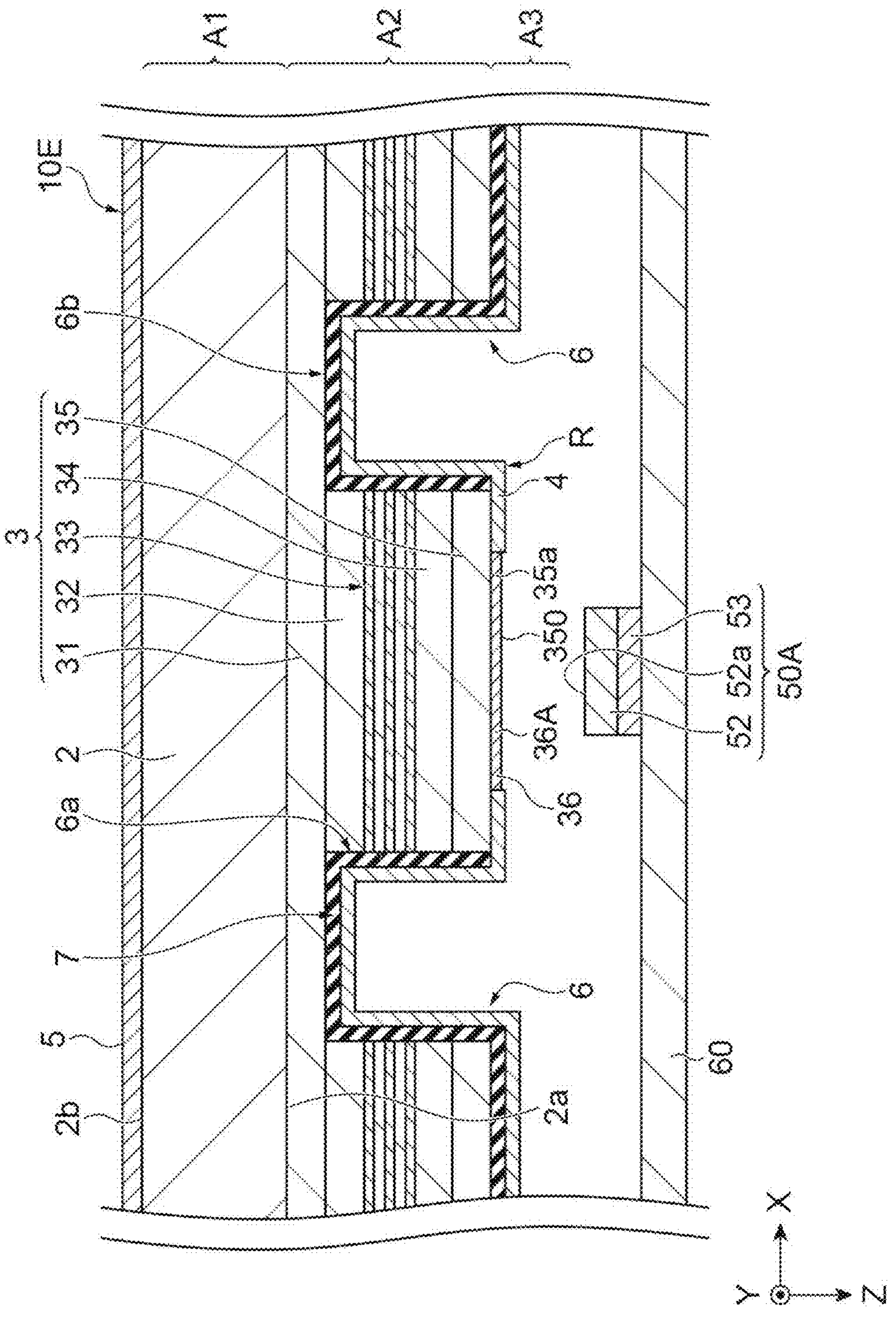
FIG. 22 is a cross-sectional view of an optical unit according to a modification example.

As shown in FIG. 22, the light transmitting portion 36 may include a semiconductor thin film 36A formed on the part 350 of the surface 35*a* of the contact layer 35. The semiconductor thin film 36A is, for example, an Si-based thin film formed of $SiO_2$, and has a lower refractive index than a compound semiconductor. The semiconductor thin film 36A is in optical contact with a waveguide member 50A. The waveguide member 50A does not have the first clad layer 51, but has only the core layer 52 and the second clad layer 53. The waveguide member 50A is in contact with the light transmitting portion 36 of an optical semiconductor device 10E on a surface 52*a* of the core layer 52. The surface 52*a* is a surface of the core layer 52 on a side opposite to the second clad layer 53. The semiconductor thin film 36A corresponds to the first clad layer 51 in the waveguide member 50 of the embodiment described above. That is, in the optical unit 1, in the contact portion C, the contact layer 35, a low refractive index thin film (the first clad layer 51 or the semiconductor thin film 36A), and the core layer 52 may be arranged in this order along the Z direction. Even with such a modification example, it is possible to introduce the light into the waveguide member 50 easily and efficiently as in the embodiment described above. In addition, since the light transmitting portion 36 includes the semiconductor thin film 36A formed on the part 350 of the surface 35*a* of the contact layer 35, the refractive index can be adjusted by selecting the material composition of the semiconductor thin film 36A. Therefore, it is possible to form a desired waveguide mode.

In the example of FIG. 22, for example, the optical semiconductor device 10E and the waveguide member 50A are fixed to each other by cleaning the semiconductor thin film 36A and the surface 52*a* facing each other and then bonding the surfaces to each other in the air. Therefore, since the air at the interface is eliminated by spontaneous bonding, a good bonding state can be obtained over the entire bonding surface. Such homogenous material bonding can be easily performed as compared with dissimilar material bonding in which the light transmitting portion 36 and the surface 35*a* of the first clad layer 51 are brought into contact with each other. In the case of the example of FIG. 22, the semiconductor thin film 36A is the third region A3 described above.

Figure 23A:
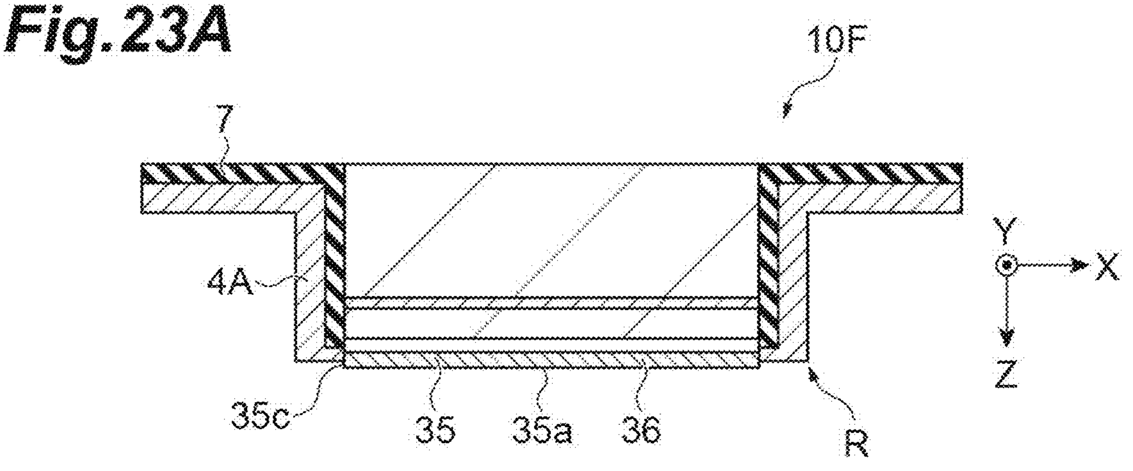
FIGS. 23A, 23B, and 23C are cross-sectional views showing the configurations of first electrodes according to modification examples.
Figure 23B:
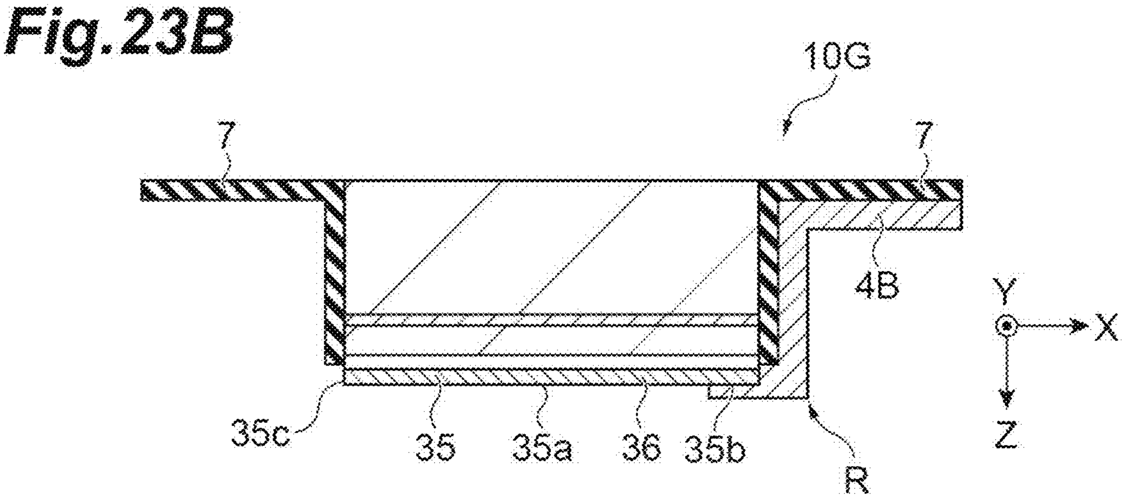
Figure 23C:
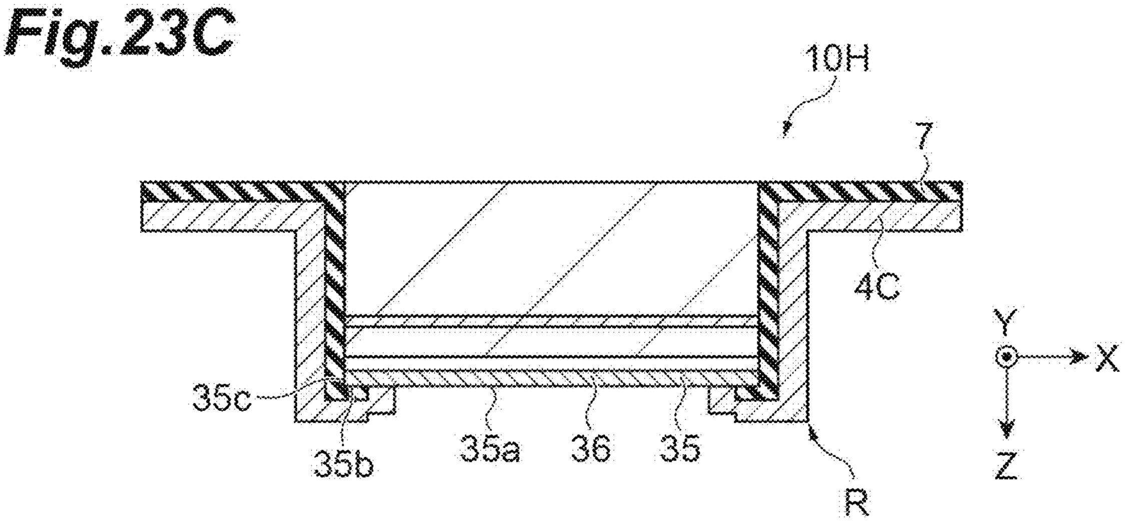

The form in which the first electrode 4 is in contact with the contact layer 35 is not limited to the example of the embodiment. FIGS. 23A, 23B, and 23C are diagrams showing the configurations of first electrodes 4A, 4B, and 4C according to modification examples. In all of the modification examples, the first electrode 4 is formed on the stacked body 3 so as to be in contact with the contact layer 35. In an optical semiconductor device 10F shown in FIG. 23A, the light transmitting portion 36 is formed by not covering the entire surface 35*a* of the contact layer 35 in the ridge portion R with the first electrode 4A. The first electrode 4A is in contact with a side surface 35*c* of the contact layer 35, and the first electrode 4A is not formed on the surface 35*a*. That is, the first electrode 4 may not be formed on the top surface of the stacked body 3, or may be formed only on the side surface of the stacked body 3.

In an optical semiconductor device 10G shown in FIG. 23B, the first electrode 4B is formed only on one side of the contact layer 35 in the X direction in the ridge portion R. The first electrode 4B is in contact with the surface 35*a*, the outer edge portion 35*b*, and the side surface 35*c* of the contact layer 35. The first electrode 4B is not formed on the other side of the contact layer 35 in the X direction in the ridge portion R. In an optical semiconductor device 10H shown in FIG. 23C, the insulating film 7 is formed on the outer edge portion 35*b* and the side surface 35*c* of the contact layer 35 in the ridge portion R. The first electrode 4C is formed on the outer edge portion 35*b* with the insulating film 7 interposed therebetween.

Even with the modification examples shown in FIGS. 23A to 23C, it is possible to introduce the light into the waveguide member 50 easily and efficiently as in the embodiment described above. In addition, in the optical semiconductor device 10F shown in FIG. 23A, since the light transmitting portion 36 is formed by not covering the entire surface 35*a* of the contact layer 35 in the ridge portion R with the first electrode 4A, it is possible to secure a wide range of contact with the waveguide member 50 in the light transmitting portion 36. As a result, it is possible to further simplify the introduction of light into the waveguide member 50. In addition, it is possible to suppress the occurrence of a situation in which the waveguide member 50 comes into contact with and interferes with the first electrode 4 when the waveguide member 50 is brought into contact with the light transmitting portion 36.

In the embodiment described above, the stacked body 3 is configured as a ridge structure. However, the stacked body 3 may have a current confinement structure formed by partially increasing the electrical resistance of the stacked body 3. In this case, the groove portion 6 is not formed in the stacked body 3, and the electrical resistance of the stacked body 3 is increased, for example, at the place where the groove portion 6 is formed. For example, the surface of the contact layer 35 in the current supply region is covered with a mask, and ions are injected from the contact layer 35 side to a predetermined depth to increase the electrical resistance in the region. Then, by removing the mask to form an electrode, a current confinement structure can be obtained. Also in this case, since the current density in the stacked body 3 can be increased, it is possible to increase the optical gain.

In the embodiment described above, the plate-shaped member 61 may be omitted, or the waveguide member 50 may be directly fixed on the substrate 60. For example, the waveguide member 50 may be provided so that the entire waveguide member 50 is embedded in the substrate 60 or the plate-shaped member 61 and the surface 51*a* is exposed on the substrate 60 or the plate-shaped member 61. Also in this case, by bringing the surface 51*a* into optical contact with the light transmitting portion 36, the optical semiconductor device 10 and the waveguide member 50 can be brought into optical contact with each other. The high reflection film 8 may be omitted, and at least one of the end surfaces 10*a* and 10*b* may be exposed. As described above, the optical semiconductor device 10 and the waveguide member 50 may be in optical contact with each other, may not be fixed or bonded to each other, or may have a minute gap formed therebetween.

What is claimed is:

1. An optical unit, comprising:

an optical semiconductor device, comprising:

a semiconductor substrate including a first main surface and a second main surface on a side opposite to the first main surface;

a stacked body that is formed on the first main surface and includes an active layer and a contact layer arranged on a side opposite to the semiconductor substrate with respect to the active layer;

a first electrode in contact with the contact layer; and a second electrode formed on the second main surface, wherein the stacked body includes a light transmitting portion formed by not covering at least part of a surface of the contact layer on a side opposite to the semiconductor substrate with the first electrode;

a third electrode; and a waveguide member formed of one or more semiconductor materials and in optical contact with the light transmitting portion, wherein the optical semiconductor device is configured such that a waveguide mode is not formed by current application within a predetermined range through the first electrode and the second electrode in a state in which the light transmitting portion is not in optical contact with the waveguide member, and a waveguide mode is formed by the current application within the predetermined range through the first electrode, the second electrode, and the third electrode in a state in which the light transmitting portion is in optical contact with the waveguide member, wherein the first electrode is electrically connected to the third electrode via solder, and wherein a thickness of the waveguide member in a direction perpendicular to the first main surface is smaller than a thickness of the solder in the direction perpendicular to the first main surface.

2. The optical unit according to claim 1, wherein the stacked body is configured as a ridge structure on the semiconductor substrate.

3. The optical unit according to claim 1, wherein, in the direction perpendicular to the first main surface, a distance from the active layer to the first main surface is longer than a distance from the active layer to the contact layer.

4. The optical unit according to claim 1, wherein the stacked body includes a pair of end surfaces perpendicular to an extending direction of the active layer, and a high reflection film is formed on each of the pair of end surfaces.

5. The optical unit according to claim 1, wherein the optical semiconductor device is configured as a semiconductor laser device.

6. The optical unit according to claim 1, wherein the stacked body includes a pair of end surfaces perpendicular to an extending direction of the active layer, and a low reflection film is formed on each of the pair of end surfaces.

7. The optical unit according to claim 1, wherein the stacked body includes a pair of end surfaces inclined with respect to an extending direction of the active layer, and a high reflection film is formed on each of the pair of end surfaces.

8. The optical unit according to claim 1, wherein the optical semiconductor device is configured as a semiconductor optical amplifier.

9. The optical unit according to claim 1, wherein, in the light transmitting portion, the at least part of the surface of the contact layer is exposed to an outside.

10. The optical unit according to claim 1, wherein the light transmitting portion includes a semiconductor thin film formed on the at least part of the surface of the contact layer.

11. The optical unit according to claim 1, wherein the entire light transmitting portion overlaps the active layer when viewed from the direction perpendicular to the first main surface.

12. The optical unit according to claim 1, wherein the light transmitting portion is formed by not covering the entire surface of the contact layer with the first electrode.

13. The optical unit according to claim 1, wherein a width of the waveguide member is narrower than a width of the contact layer of the optical semiconductor device.

14. The optical unit according to claim 1, wherein, assuming that a cross section that passes through a contact portion between the light transmitting portion and the waveguide member and is perpendicular to the first main surface is a first cross section and a cross section that passes through the light transmitting portion but does not pass through the contact portion and is perpendicular to the first main surface is a second cross section, the optical unit is configured such that a waveguide mode is formed within the optical semiconductor device by the current application in the first cross section, and no waveguide mode is formed within the optical semiconductor device by the current application in the second cross section.

15. A method for manufacturing an optical unit, comprising:

a first step of preparing the optical semiconductor device according to claim 1, a waveguide member formed of one or more semiconductor materials, and a third electrode on which solder is formed on an upper surface; and a second step of fixing the optical semiconductor device and the waveguide member to each other by joining a first electrode of the optical semiconductor device and the third electrode to each other with the solder in a state in which the light transmitting portion of the optical semiconductor device and the waveguide member are in optical contact with each other, wherein, in the second step, the optical semiconductor device and the waveguide member are fixed to each other such that the thickness of the waveguide member in the direction perpendicular to the first main surface is smaller than the thickness of the solder in the direction perpendicular to the first main surface.

16. The method for manufacturing the optical unit according to claim 15, wherein, in the first step, the waveguide member fixed on a substrate is prepared, and in the second step, the optical semiconductor device and the waveguide member are fixed to each other by fixing the optical semiconductor device and the substrate to each other.

* * * * *